(12) United States Patent
Kang et al.

(10) Patent No.: US 12,068,327 B2
(45) Date of Patent: Aug. 20, 2024

(54) METHOD FOR FABRICATING MASK, METHOD FOR FABRICATING SEMICONDUCTOR DEVICE USING THE MASK, AND THE SEMICONDUCTOR DEVICE FABRICATED USING THE MASK

(71) Applicant: SAMSUNG ELECTRONICS CO., LTD., Suwon-si (KR)

(72) Inventors: Myoung-Ho Kang, Suwon-si (KR); Yong-Ah Kim, Seongnam-si (KR); Dong Hyo Park, Seoul (KR); Seong-Yul Park, Hwaseong-si (KR); Chang Hyeon Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 469 days.

(21) Appl. No.: 17/454,303

(22) Filed: Nov. 10, 2021

(65) Prior Publication Data
US 2022/0302176 A1     Sep. 22, 2022

(30) Foreign Application Priority Data
Mar. 16, 2021 (KR) .......................... 10-2021-0033976

(51) Int. Cl.
    *H01L 27/12*     (2006.01)
    *G03F 7/00*     (2006.01)
    (Continued)

(52) U.S. Cl.
CPC ...... *H01L 27/1222* (2013.01); *G03F 7/70441* (2013.01); *H01L 29/41775* (2013.01); *H01L 29/78696* (2013.01)

(58) Field of Classification Search
CPC .......... H01L 27/1222; H01L 29/41775; H01L 29/78696; H01L 21/823412;
(Continued)

(56) References Cited

U.S. PATENT DOCUMENTS 8,091,047 B1    1/2012   Gennari et al.
8,701,052 B1    4/2014   Kuo et al.
(Continued)

FOREIGN PATENT DOCUMENTS

KR    10-2015-0109247     10/2015

*Primary Examiner* — Tong-Ho Kim
(74) *Attorney, Agent, or Firm* — F. CHAU & ASSOCIATES, LLC

(57) ABSTRACT

A semiconductor device is provided. The semiconductor device comprises a substrate including a first region, a second region, and a connecting region placed between the first region and the second region, a plurality of first multi-channel active patterns placed in the first region of the substrate, a plurality of second multi-channel active patterns placed in the second region of the substrate, a first connecting fin type pattern which is placed in the connecting region of the substrate and extends from the first region to the second region in a first direction, and a field insulating film which is placed on the substrate and covers an upper surface of the first connecting fin type pattern, wherein a width of the first connecting fin type pattern in a second direction decreases and then increases as it goes away from the first region, and the first direction is perpendicular to the second direction.

20 Claims, 39 Drawing Sheets

(51) Int. Cl.
   *G03F 7/20* (2006.01)
   *H01L 29/417* (2006.01)
   *H01L 29/786* (2006.01)

(58) Field of Classification Search
   CPC ........... H01L 27/0207; H01L 29/42392; H01L 29/0673; H01L 29/775; H01L 27/0886; H01L 21/823431; H01L 21/823475; H01L 21/823437; H01L 21/823462; H01L 21/823481; H01L 27/088; G03F 7/70441; G03F 1/36; G03F 1/76; G03F 1/80; G03F 1/70; G03F 7/705; B82Y 10/00
   USPC ........................................................ 257/288
   See application file for complete search history.

(56) References Cited

U.S. PATENT DOCUMENTS

| | | |
|---|---|---|
| 9,594,866 B2 | 3/2017 | Wang et al. |
| 10,691,859 B2 | 6/2020 | Seo et al. |
| 2009/0217224 A1 | 8/2009 | Wiaux et al. |
| 2018/0090493 A1* | 3/2018 | Kwak ................... H01L 29/785 |
| 2022/0005946 A1* | 1/2022 | Kim ................... H01L 29/42392 |

* cited by examiner

METHOD FOR FABRICATING MASK, METHOD FOR FABRICATING SEMICONDUCTOR DEVICE USING THE MASK, AND THE SEMICONDUCTOR DEVICE FABRICATED USING THE MASK

CROSS-REFERENCE TO RELATED APPLICATION

This application claims priority under 35 U.S.C. § 119 to Korean Patent Application No. 10-2021-0033976, filed on Mar. 16, 2021 in the Korean Intellectual Property Office, the contents of which are incorporated by reference herein in their entirety.

TECHNICAL FIELD

The present disclosure relates to a method for fabricating a mask, a method for fabricating a semiconductor device using the mask, and a semiconductor device fabricated using the mask.

DISCUSSION OF RELATED ART

To fabricate highly integrated semiconductor elements, patterns are miniaturized. In the fabricating process of integrating many elements in a small area, the size of each element needs to be formed as small as possible, and a pitch, which is the sum of the width of each pattern to be formed and an interval between the patterns, needs to be made small as well.

Recently, there is a sharp decrease in design rule of semiconductor elements. However, there is a limit in forming patterns having a fine pitch for implementing these semiconductor elements, due to resolution limits of the available photolithography processes.

SUMMARY

The present disclosure provides a semiconductor device capable of reducing a chip area, while ensuring the operating characteristics of transistors formed in different regions by preventing the transistors formed in different regions from interfering with each other.

The present disclosure also provides a method for fabricating a mask capable of reducing the chip area, while ensuring the operating characteristics of transistors formed in different regions by preventing the transistors formed in different regions from interfering with each other.

The present disclosure also provides a method for fabricating a semiconductor device capable of reducing the chip area, while ensuring the operating characteristics of transistors formed in different regions by preventing the transistors formed in different regions from interfering with each other.

According to an embodiment of the present disclosure, there is provided a semiconductor device including a substrate including a first region, a second region, and a connecting region placed between the first region and the second region, a plurality of first multi-channel active patterns placed in the first region of the substrate, a plurality of second multi-channel active patterns placed in the second region of the substrate, a first connecting fin type pattern which is placed in the connecting region of the substrate and extends from the first region to the second region in a first direction, and a field insulating film which is placed on the substrate and covers an upper surface of the first connecting fin type pattern, in which a width of the first connecting fin type pattern in the second direction decreases and then increases as it goes away from the first region, and the first direction is perpendicular to the second direction.

According to an embodiment of the present disclosure, there is provided a semiconductor device including a substrate including a first region, a second region, and a connecting region placed between the first region and the second region, a plurality of first multi-channel active patterns placed in the first region of the substrate, a plurality of second multi-channel active patterns placed in the second region of the substrate, a first connecting fin type pattern which is placed in the connecting region of the substrate and extends from the first region to the second region in a first direction and a field insulating film which is placed on the substrate and covers an upper surface of the first connecting fin type pattern, in which the first connecting fin type pattern includes a bridge portion, and a first branch portion and a second branch portion protruding from the bridge portion toward the first region, and the first branch portion and the second branch portion are spaced apart from each other in a second direction perpendicular to the first direction.

According to an embodiment of the present disclosure, there is provided a semiconductor device including a substrate including a first region, a second region, and a connecting region placed between the first region and the second region, a plurality of first multi-channel active patterns placed in the first region of the substrate, a plurality of second multi-channel active patterns placed in the second region of the substrate, a first connecting fin type pattern which is placed in the connecting region of the substrate and extends from the first region to the second region in a first direction, a second connecting fin type pattern which is placed in the connecting region of the substrate and has a half ring-shaped upper surface, a third connecting fin type pattern which is placed between the first connecting fin type pattern and the second connecting fin type pattern, and extends in the first direction along a profile of an outer side wall of the first connecting fin type pattern, a field insulating film which is placed on the substrate and covers an upper surface of the first connecting fin type pattern, an upper surface of the second connecting fin type pattern, and an upper surface of the third connecting fin type pattern, a first gate electrode which extends in a second direction perpendicular to the first direction, on the first multi-channel active patterns, and a second gate electrode which extends in the second direction, on the second multi-channel active patterns, in which a width of the first connecting fin type pattern in the second direction decreases and then increases, as it goes away from the first region.

According to an embodiment of the present disclosure, there is provided a method for fabricating a mask, the method including generating a virtual target pattern, a fragment and a virtual evaluation point between a first target pattern and a second target pattern overlapping in a length direction, inputting a first mask data to an OPC model to extract a first contour of the first target pattern and the second target pattern through simulation, the first mask data including the fragment, calculating a first virtual EPE (edge placement error) between the first contour and the virtual target pattern at the virtual evaluation point, after determining a displacement of the fragment using the first virtual EPE, moving the fragment by the displacement, inputting a second mask data including the moved fragment to the OPC model to extract a second contour of the first target pattern and the second target pattern through simulation, calculating a second virtual EPE between the second contour and the virtual target pattern, at the virtual evaluation point, and when the second virtual EPE is equal to or less than a set reference value, or when a number of times of simulation performed by the OPC model corresponds to a set reference number of times, determining a final mask data.

According to an embodiment of the present disclosure, there is provided a method for fabricating a semiconductor device, the method including fabricating a mask, and performing a photo process on a substrate, using the mask, wherein fabricating the mask includes generating a virtual target pattern, a fragment and a virtual evaluation point between a first target pattern and a second target pattern overlapping in a length direction, inputting a first mask data to an OPC model to extract a first contour of the first target pattern and the second target pattern through simulation, the first mask data including the fragment, calculating a first virtual EPE between the first contour and the virtual target pattern at the virtual evaluation point, after determining a displacement of the fragment using the first virtual EPE, moving the fragment by the displacement, inputting a second mask data including the moved fragment to the OPC model to extract a second contour of the first target pattern and the second target pattern through simulation, calculating a second virtual EPE between the second contour and the virtual target pattern, at the virtual evaluation point, and when the second virtual EPE is equal to or less than a set reference value, or when a number of times of simulation performed by the OPC model corresponds to a set reference number of times, determining a final mask data.

BRIEF DESCRIPTION OF THE DRAWINGS

The above and other aspects and features of the present disclosure will become more apparent by describing in detail exemplary embodiments thereof referring to the accompanying drawings, in which.

Figure 1:
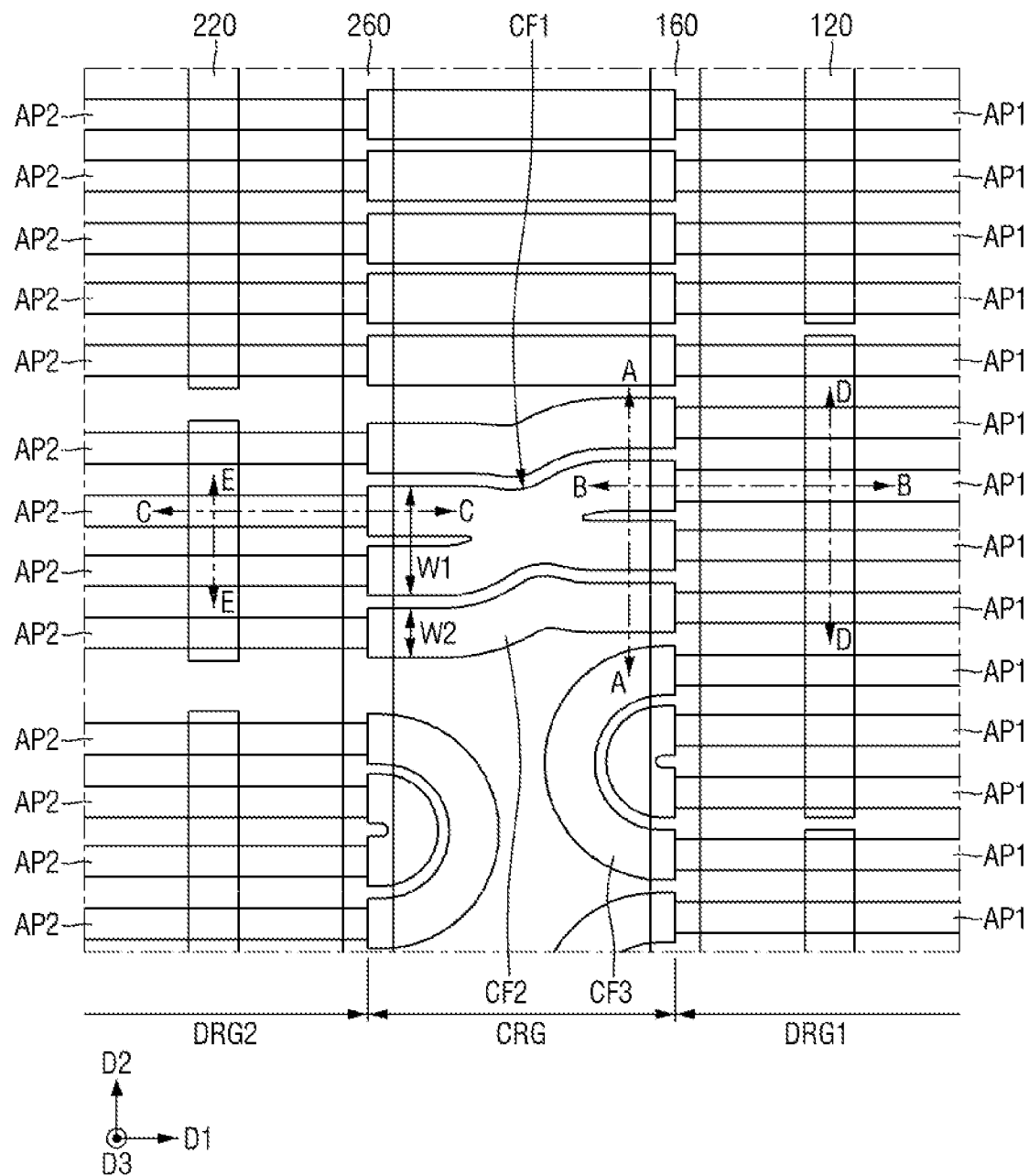
FIG. 1 is an exemplary layout diagram for explaining a semiconductor device according to an embodiment of the present disclosure.

Since the drawings in FIGS. 1-34B are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Although drawings of a semiconductor device according to an embodiment of the present disclosure show a fin type transistor (fin field effect transistor, FinFET) including a channel region of a fin type pattern shape, a transistor including a nanowire or a nanosheet, and a multi-bridge channel field effect transistor (MBCFET™) as examples, the present disclosure is not limited thereto. For example, the semiconductor device according to an embodiment of the present disclosure may include a tunneling transistor (tunneling FET) or a three-dimensional (3D) transistor. The semiconductor device according to an embodiment of the present disclosure may, of course, include a planar transistor. Further, the semiconductor device according to an embodiment of the present disclosure may also include a bipolar junction transistor (BJT), a laterally diffused metal oxide semiconductor (LDMOS), or the like.

Figure 2:
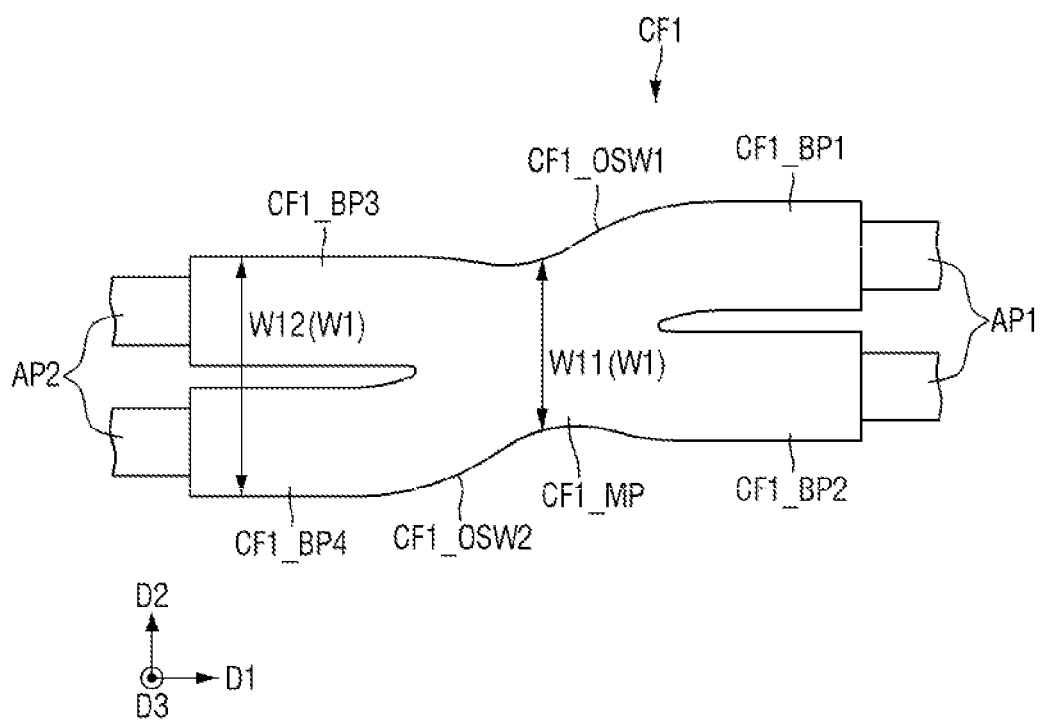
FIG. 2 is a diagram for explaining a first connecting fin type pattern of FIG. 1.
Figure 3:
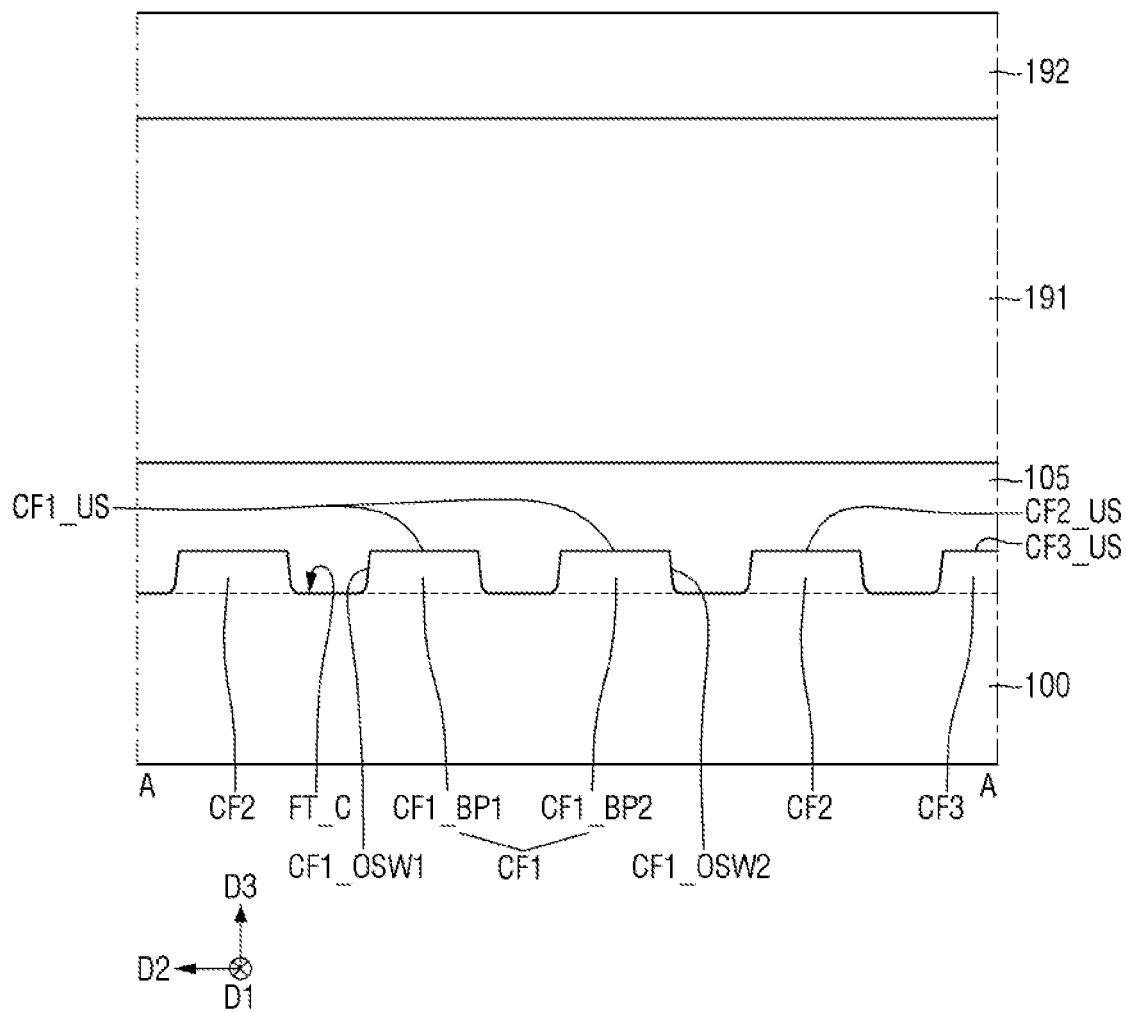
FIGS. 3 to 7 are exemplary diagrams taken along A-A, B-B, C-C, D-D and E-E of FIG. 1.

FIG. 1 is an exemplary layout diagram for explaining a semiconductor device according to an embodiment of the present disclosure. FIG. 2 is a diagram for explaining a first connecting fin type pattern of FIG. 1. FIGS. 3 to 7 are exemplary diagrams taken along A-A, B-B, C-C, D-D and E-E of FIG. 1, respectively.

In the semiconductor device to be described below, a fin type transistor (FinFET) including a fin type pattern-shaped channel region may be formed in a first element region DRG1 and a second element region DRG2.

Referring to FIGS. 1 to 7, the semiconductor device according to an embodiment of the present disclosure may include a plurality of first multi-channel active patterns AP1, a plurality of second multi-channel active patterns AP2, a first connecting fin type pattern CF1, a second connecting fin type pattern CF2, a third connecting fin type pattern CF3, a first gate electrode 120, and a second gate electrode 220.

The substrate 100 may include a first element region DRG1, a second element region DRG2, and a connecting region CRG. The connecting region CRG may be placed between the first element region DRG1 and the second element region DRG2, and may separate the first element region DRG1 and the second element region DRG2 from each other. The first element region DRG1 and the second element region DRG2 may be spaced apart from each other in a first direction D1 with the connecting region CRG placed between them.

The first element region DRG1 and the second element region DRG2 may be one of a SRAM region, a logic region, and an I/O region, respectively. In an embodiment of the present disclosure, the first element region DRG1 and the second element region DRG2 may be the same region. In an embodiment of the present disclosure, the first element region DRG1 and the second element region DRG2 may be different regions from each other. In an embodiment of the present disclosure, the first element region DRG1 may be SRAM region, and the second element region DRG2 may be logic region, but the present disclosure is not limited thereto.

The connecting region CRG may correspond to a buffer region for securing a separation distance to prevent the transistors of the first element region DRG1 and the second element region DRG2 from interfering with each other, when the transistors of the first element region DRG1 and the second element region DRG2 are in operation.

The substrate 100 may be a silicon (Si) substrate or a silicon-on-insulator (SOI) substrate. Alternatively, the substrate 100 may include, but is not limited to, silicon germanium (SiGe), silicon germanium on insulator (SGOI), indium antimonide (InSb), lead tellurium (PbTe) compounds, indium arsenide (InAs), indium phosphide (InP), gallium arsenide (GaAs), gallium phosphide (GaP), gallium antimonide (GaSb) or indium gallium arsenide (InGaAs). In addition, the substrate 100 may include one or more semiconductor layers or structures and may include active or operable portions of semiconductor devices. In the following description, the substrate 100 will be described as a silicon (Si) substrate.

A plurality of first multi-channel active patterns AP1 may be placed in the first element region DRG1 of the substrate 100. Each of the first multi-channel active patterns AP1 may protrude from the substrate 100.

The first multi-channel active pattern AP1 may extend long along the first direction D1. For example, the first multi-channel active pattern AP1 may include a long side extending in the first direction D1, and a short side extending in a second direction D2. In the first element region DRG1, the plurality of first multi-channel active patterns AP1 may be arranged in the second direction D2, and may extend in parallel to each other in the first direction D1. Here, the first direction D1 may intersect the second direction D2 and a third direction D3. Also, the second direction D2 may intersect the third direction D3. The third direction D3 may be a thickness direction of the substrate 100. In an embodiment of the present disclosure, the first direction may be perpendicular to the second direction.

Figure 6:
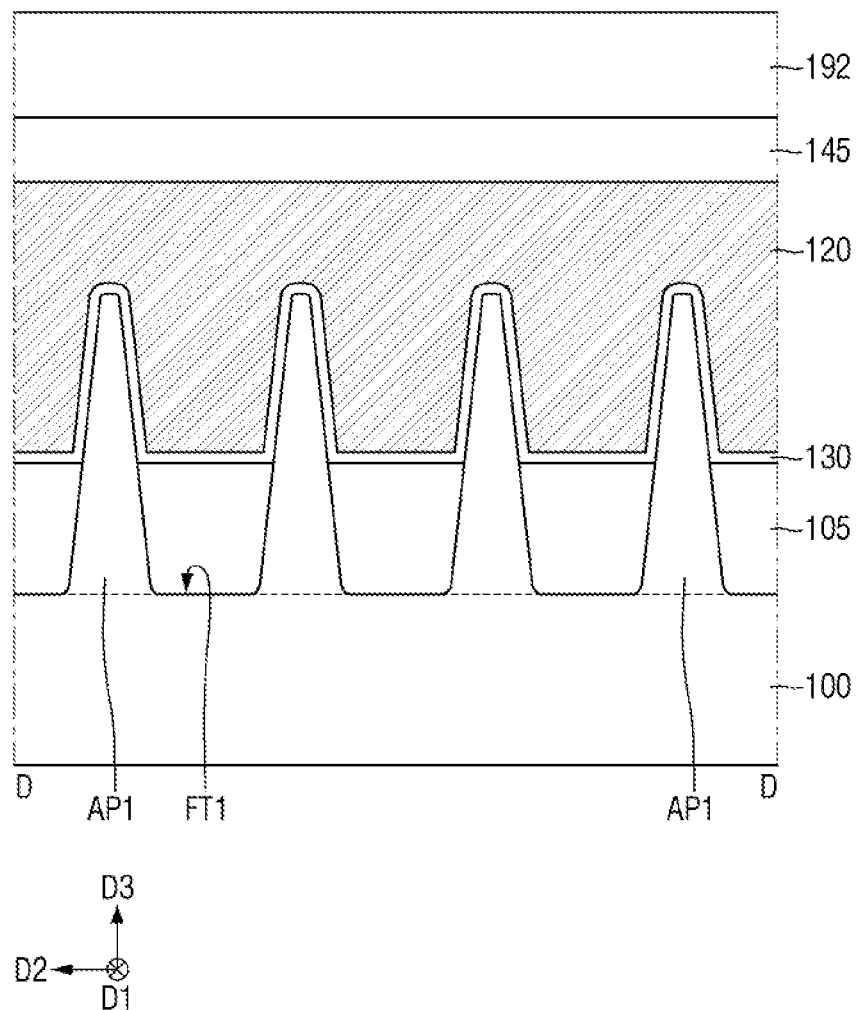

The first multi-channel active pattern AP1 may be defined by a first fin trench FT1 extending in the first direction D1. For example, the first multi-channel active pattern AP1 may correspond to a portion of the substrate that is defined by the first fin trench FT1. The first fin trench FT1 may be placed on either side of the first multi-channel active pattern AP1. For example, each of the first multi-channel active patterns AP1 may be a fin type pattern. The side wall of the first multi-channel active pattern AP1 may be defined by the first fin trench FT1. In FIG. 6, the width of the first multi-channel active pattern AP1 in the second direction D2 may decrease as it goes away from the substrate 100 in the third direction D3. For example, the first multi-channel active pattern AP1 may have a sloped sidewall profile.

The plurality of second multi-channel active patterns AP2 may be placed in the second element region DRG2 of the substrate 100. Each second multi-channel active pattern AP2 may protrude from the substrate 100.

The second multi-channel active pattern AP2 may extend long along the first direction D1. The second multi-channel active pattern AP2 may include a long side extending in the first direction D1, and a short side extending in the second direction D2. In the second element region DRG2, the plurality of second multi-channel active patterns AP2 may be arranged in the second direction D2, and may extend in parallel to each other in the first direction D1.

Figure 7:
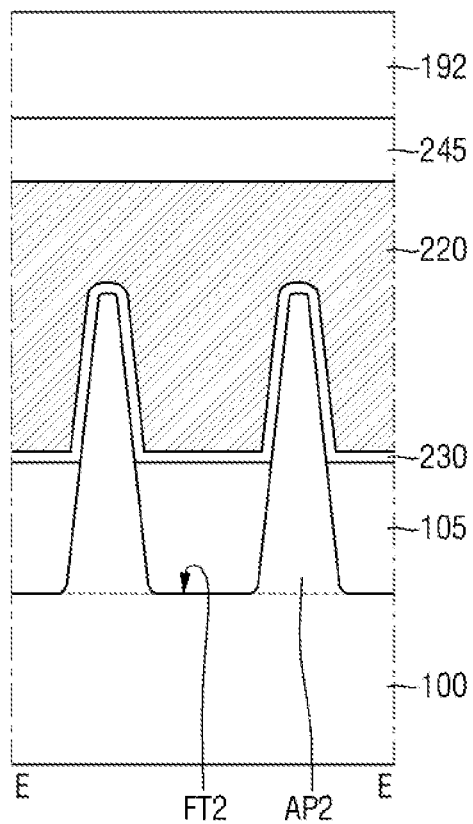

The second multi-channel active pattern AP2 may be defined by a second fin trench FT2 extending in the first direction D1. For example, second multi-channel active pattern AP2 may correspond to a portion of the substrate that is defined by the second fin trench FT2. The second fin trench FT2 may be placed on either side of the second multi-channel active pattern AP2. For example, each of the second multi-channel active patterns AP2 may be a fin type pattern. The side wall of the second multi-channel active pattern AP2 may be defined by the second fin trench FT2. In FIG. 7, the width of the second multi-channel active pattern AP2 in the second direction D2 may decrease as it goes away from the substrate 100 in the third direction D3. For example, the second multi-channel active pattern AP2 may have a sloped sidewall profile.

The first multi-channel active pattern AP1 and the second multi-channel active pattern AP2 may each be a part of the substrate 100, and/or may include an epitaxial layer that is grown from the substrate 100. The first multi-channel active pattern AP1 and the second multi-channel active pattern AP2 may include, for example, silicon (Si) or germanium (Ge), which is an elemental semiconductor material. Further, the first multi-channel active pattern AP1 and the second multi-channel active pattern AP2 may include a compound semiconductor material, and may include, for example, a group IV-IV compound semiconductor material or a group III-V compound semiconductor material.

The group IV-IV compound semiconductor may include, for example, a binary compound or a ternary compound including at least two or more of, for example, carbon (C), silicon (Si), germanium (Ge), or tin (Sn), or a compound obtained by doping these elements with a group IV element. The group IV-IV compound semiconductor may include, for example, silicon-germanium (SiGe), silicon carbide (SiC), or silicon germanium carbide (SiGeC), but the present disclosure is not limited thereto.

The group III-V compound semiconductor may be, for example, at least one of a binary compound, a ternary compound or a quaternary compound formed by combining at least one of the group III elements and at least one of the group V elements. The group III elements may include, for example, boron (B), aluminum (Al), gallium (Ga) and indium (In), and the group V elements may include, for example, nitrogen (N), phosphorus (P), arsenic (As) and antimony (Sb). The group III-V compound semiconductor may include, for example, gallium phosphide (GaP), gallium arsenide (GaAs), indium arsenide (InAs), indium phosphide (InP), gallium antimonide (GaSb), indium antimonide (InSb), aluminum gallium arsenide (AlGaAs), indium gallium arsenide (InGaAs), or aluminum indium gallium phosphide (AlInGaP) but the present disclosure is not limited thereto.

In the semiconductor device according to an embodiment of the present disclosure, the first multi-channel active pattern AP1 and the second multi-channel active pattern AP2 may be fin type patterns, respectively.

The first connecting fin type pattern CF1, the second connecting fin type pattern CF2, and the third connecting fin type pattern CF3 may be placed in the connecting region CRG of the substrate 100, respectively. For example, the first connecting fin type pattern CF1, the second connecting fin type pattern CF2, and the third connecting fin type pattern CF3 may be placed between the first element region DRG1 and the second element region DRG2, respectively.

The first connecting fin type pattern CF1, the second connecting fin type pattern CF2, and the third connecting fin type pattern CF3 may each protrude from the substrate 100, and may be defined by a fin-cut trench FT_C, respectively. For example, in the fabricating process, the first fin trench FT1, the second fin trench FT2 and the fin-cut trench FT_C may be formed at the same level. Here, the term "same level" means that they are formed by the same fabricating process.

The first connecting fin type pattern CF1 may extend in the first direction D1 from the first element region DRG1 to the second element region DRG2. Also, the second connecting fin type pattern CF2 may extend from the first element region DRG1 to the second element region DRG2 in the first direction D1. The third connecting fin type pattern CF3 protrudes from the first element region DRG1 in the first direction D1, but does not extend to the second element region DRG2. Alternatively, the third connecting fin type pattern CF3 protrudes from the second element region DRG2 in the first direction D1, but does not extend to the first element region DRG1.

The first element region DRG1 and the connecting region CRG may be distinguished on the basis of an end of the first connecting fin type pattern CF1, an end of the second connecting fin type pattern CF2, and an end of the third connecting fin type pattern CF3. For example, a boundary between the first element region DRG1 and the connecting region CRG may be defined by the ends of the first connecting fin type pattern CF1, the second connecting fin type pattern CF2, and the third connecting fin type pattern CF3 that are in contact with the first multi-channel active pattern AP1. The second element region DRG2 and the connecting region CRG may be distinguished on the basis of the end of the first connecting fin type pattern CF1, the end of the second connecting fin type pattern CF2, and the end of the third connecting fin type pattern CF3. For example, a boundary between the connecting region CRG and the second element region DRG2 may be defined by the ends of the first connecting fin type pattern CF1, the second connecting fin type pattern CF2, and the third connecting fin type pattern CF3 that are in contact with the second multi-channel active pattern AP2.

In the semiconductor device according to an embodiment of the present disclosure, an upper surface CF1_US of the first connecting fin type pattern may have an "X" shape. For example, the first connecting fin type pattern CF1 may include a bridge portion CF1_MP, and first to fourth branch portions CF1_BP1, CF1_BP2, CF1_BP3, and CF1_BP4.

A first branch portion CF1_BP1 and a second branch portion CF1_BP2 may protrude from the bridge portion CF1_MP in the first direction D1. For example, the first branch portion CF1_BP1 and the second branch portion CF1_BP2 may protrude from the bridge portion CF1_MP toward the first element region DRG1, and may be spaced apart from each other in the second direction D2.

A third branch portion CF1_BP3 and a fourth branch portion CF1_BP4 may protrude from the bridge portion CF1_MP in the first direction D1. For example, the third branch portion CF1_BP3 and the fourth branch portion CF1_BP4 may protrude from the bridge portion CF1_MP toward the second element region DRG2, and may be spaced apart from each other in the second direction D2.

The first connecting fin type pattern CF1 may include a first outer side wall CF1_OSW1 and a second outer side wall CF1_OSW2 extending in the first direction D1. For example, the first outer side wall CF1_OSW1 and the second outer side wall CF1_OSW2 may each be bent and curved to change the extending direction slightly, but overall, may extend in the first direction D1. The first outer side wall CF1_OSW1 of the first connecting fin type pattern and the second outer side wall CF1_OSW2 of the first connecting fin type pattern may continuously extend from the first element region DRG1 to the second element region DRG2 in the first direction D1, respectively.

The first outer side wall CF1_OSW1 of the first connecting fin type pattern may be the side wall of the first branch portion CF1_BP1, the bridge portion CF1_MP and the third branch portion CF1_BP3. The second outer side wall CF1_OSW2 of the first connecting fin type pattern may be the side wall of the second branch portion CF1_BP2, the bridge portion CF1_MP and the fourth branch portion CF1_BP4.

The first branch portion CF1_BP1 may include a first side wall and a second side wall. The first side wall of the first branch portion CF1_BP1 may be opposite to the second side wall of the first branch portion CF1_BP1 in the second direction D2. When the first side wall of the first branch portion CF1_BP1 faces the second branch portion CF1_BP2, the first outer side wall CF1_OSW1 of the first connecting fin type pattern includes the second side wall of the first branch portion CF1_BP1. For example, the second branch portion CF1_BP2 is closer to the first side wall of the first branch portion CF1_BP1 than to the first outer side wall CF1_OSW1 of the first connecting fin type pattern.

The width W1 of the first connecting fin type pattern CF1 in the second direction D2 may decrease and then increase, as it goes away from the first element region DRG1. The width W1 of the first connecting fin type pattern CF1 in the second direction D2 may be a width between the first outer side wall CF1_OSW1 of the first connecting fin type pattern and the second outer side wall CF1_OSW2 of the first connecting fin type pattern in the second direction D2. For example, the width W1 of the first connecting fin type pattern CF1 in the second direction D2 may be a width of the upper surface CF1_US of the first connecting fin type pattern in the second direction D2.

To explain in another way, at a first point located at a first distance from the first element region DRG1 or from the second element region DRG2, the width W1 of the first connecting fin type pattern CF1 in the second direction D2 may be a first width W12. For example, the first point may be located at a portion of the first connecting fin type pattern CF1 having the first branch portion CF1_BP1 and the second branch portion CF1_BP2 overlapping with each other in the second direction D2, or a portion of the first connecting fin type pattern CF1 having the third branch portion CF1_BP3 and the fourth branch portion CF1_BP4 overlapping with each other in the second direction D2. Also, at a second point which is farther than the first distance from the first element region DRG1 or from the second element region DRG2, the width W1 of the first connecting fin type pattern CF1 in the second direction D2 may be a second width W11. For example, the second point may be located at the bridge portion CF1_MP of the first connecting fin type pattern CF1. The first width W12 of the first connecting fin type pattern CF1 in the second direction D2 at the first point is greater than the second width W11 of the first connecting fin type pattern CF1 in the second direction D2 at the second point.

In the bridge portion CF1_MP of the first connecting fin type pattern CF1, the width W1 of the bridge portion CF1_MP of the first connecting fin type pattern in the second direction D2 may decrease and then increase, as it goes away from the first branch portion CF1_BP1 and the second branch portion CF1_BP2.

A plurality of second connecting fin type patterns CF2 may be placed in the connecting region CRG of the substrate 100. The second connecting fin type patterns CF2 may be placed on both sides of the first connecting fin type pattern CF1. Described in another way, the first connecting fin type pattern CF1 is placed between the second connecting fin type patterns CF2. Although one first connecting fin type pattern CF1 is shown as an example in FIG. 1, the present disclosure is not limited thereto. For example, the semiconductor device according to an embodiment of the present disclosure may include a plurality of first connecting fin type patterns CF1.

The second connecting fin type pattern CF2 which is closest to the first connecting fin type pattern CF1 may extend in the first direction D1 along a profile of the first connecting fin type pattern CF1. For example, the second connecting fin type pattern CF2 may be bent and curved to change the extending direction slightly, but overall, may extend in the first direction D1 along the profile of the first connecting fin type pattern CF1. That is, the second connecting fin type pattern CF2 which is closest to the first connecting fin type pattern CF1 is placed along the profile of the first outer side wall CF1_OSW1 of the first connecting fin type pattern and the second outer side wall CF1_OSW2 of the first connecting fin type pattern.

The upper surface CF2_US of the second connecting fin type pattern may have a line shape that extends in the first direction D1. The line shape of the upper surface CF2_US of the second connecting fin type pattern may not be a straight line and may have a portion being bent or curved. The width W2 of the second connecting fin type pattern CF2 in the second direction D2 is smaller than the width W1 of the first connecting fin type pattern CF1 in the second direction D2. The second connecting fin type pattern CF2 may have the width W2 being about constant between the first element region DRG1 and the second element region DRG2. The width W1 of the first connecting fin type pattern CF1 in the second direction D2 is greater than the width W2 of the second connecting fin type pattern CF2 in the second direction D2, at the point where the width W1 of the first connecting fin type pattern CF1 in the second direction D2 is the smallest.

A pair of third connecting fin type patterns CF3 protrude from the first element region DRG1 or the second element region DRG2. For example, different from the first connecting fin type pattern CF1 and the second connecting fin type pattern CF2, the ends of each third connecting fin type pattern CF3 may be located only at the boundary between the first element region DRG1 and the connecting region CRG, or only at the boundary between the connecting region CRG and the second element region DRG2. For example, the pair of third connecting fin type patterns CF3 may include a third inner connecting fin type pattern and a third outer connecting fin type pattern. The third inner connecting fin type pattern and the third outer connecting fin type pattern may each protrude from the first element region DRG1 in the first direction D1. The third outer connecting fin type pattern is placed along the outer side wall of the third inner connecting fin type pattern and spaced apart from the third inner connecting fin type pattern.

Between the first connecting fin type pattern CF1 and the third connecting fin type pattern CF3, the second connecting fin type pattern CF2 is placed along the profile of the outer side wall of the first connecting fin type pattern CF1. For example, a single second connecting fin type pattern CF2 is placed between the first connecting fin type pattern CF1 and the third connecting fin type pattern CF3 closest to each other. Further, when a first pair of third connecting fin type patterns CF3 protrudes from the first element region DRG1, a second pair of third connecting fin type patterns CF3 protrudes from the second element region DRG2. For example, the ends of the first pair of third connecting fin type patterns CF3 may be located at the boundary between the first element region DRG1 and the connecting region CRG, and the ends of the second pair of third connecting fin type patterns CF3 may be located at the boundary between the connecting region CRG and the second element region DRG2. The first pair of third connecting fin type patterns CF3 may be closest to the second pair of third connecting fin type patterns CF3.

An upper surface CF3_US of the third connecting fin type pattern may have a half ring shape. Unlike that shown, the upper surface CF3_US of the third connecting fin type pattern may have a semi-circular shape.

A single first connecting fin type pattern CF1 may be directly connected to two or less first multi-channel active patterns AP1. One or both of the first branch portion CF1_BP1 and the second branch portion CF1_BP2 may be directly connected to the first multi-channel active patterns AP1. Further, the single first connecting fin type pattern CF1 may be directly connected to two or less second multi-channel active patterns AP2. One or both of the third branch portion CF1_BP3 and the fourth branch portion CF1_BP4 may be directly connected to the second multi-channel active patterns AP2.

Unlike that shown, the single first connecting fin type pattern CF1 may not be directly connected to the first multi-channel active pattern AP1 and the second multi-channel active pattern AP2. That is, the first branch portion CF1_BP1 and the second branch portion CF1_BP2 are not directly connected to the first multi-channel active pattern AP1, respectively. The third branch portion CF1_BP3 and the fourth branch portion CF1_BP4 are not directly connected to the second multi-channel active pattern AP2, respectively.

In the semiconductor device according to an embodiment of the present disclosure, the first connecting fin type pattern CF1 may be directly connected to two first multi-channel active patterns AP1 and two second multi-channel active patterns AP2. For example, the first branch portion CF1_BP1 and the second branch portion CF1_BP2 may each be directly connected to the first multi-channel active pattern AP1. The third branch portion CF1_BP3 and the fourth branch portion CF1_BP4 may each be directly connected to the second multi-channel active pattern AP2.

The single second connecting fin type pattern CF2 may be directly connected to one or less first multi-channel active pattern AP1. Further, the single second connecting fin type pattern CF2 may be directly connected to one or less second multi-channel active pattern AP2.

In the semiconductor device according to an embodiment of the present disclosure, at least one or more second connecting fin type patterns CF2 may be directly connected to the single first multi-channel active pattern AP1 and the single second multi-channel active pattern AP2.

The single third connecting fin type pattern CF3 may be directly connected to two or less first multi-channel active patterns AP1. Alternatively, the single third connecting fin type pattern CF3 may be directly connected to two or less second multi-channel active patterns AP2.

In the semiconductor device according to an embodiment of the present disclosure, at least one or more third connecting fin type patterns CF3 may be directly connected to two first multi-channel active patterns AP1. At least one or more third connecting fin type patterns CF3 may be directly connected to two second multi-channel active patterns AP2. The single third connecting fin type pattern CF3 is directly connected to the first multi-channel active pattern AP1 or the second multi-channel active pattern AP2.

In FIG. 1, the width of the end of the first connecting fin type pattern CF1, the end of the second connecting fin type pattern CF2, and the end of the third connecting fin type pattern CF3 in the second direction D2 is shown as being greater than the width of the first multi-channel active pattern AP1 in the second direction D2, at the boundary between the first element region DRG1 and the connecting region CRG. Further, the width of the end of the first connecting fin type pattern CF1, the end of the second connecting fin type pattern CF2, and the end of the third connecting fin type pattern CF3 in the second direction D2 is shown as being greater than the width of the second multi-channel active pattern AP2 in the second direction D2, at the boundary between the second element region DRG2 and the connecting region CRG.

Figure 4:
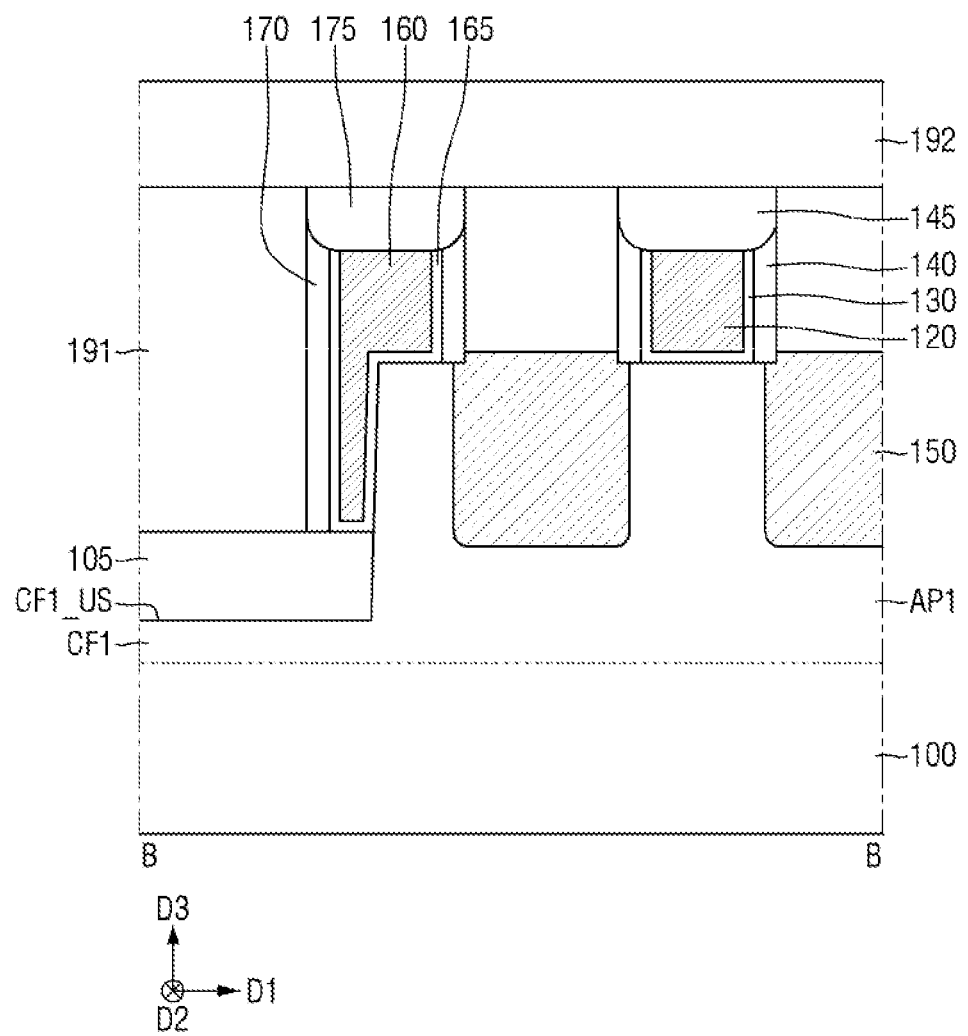
Figure 5:
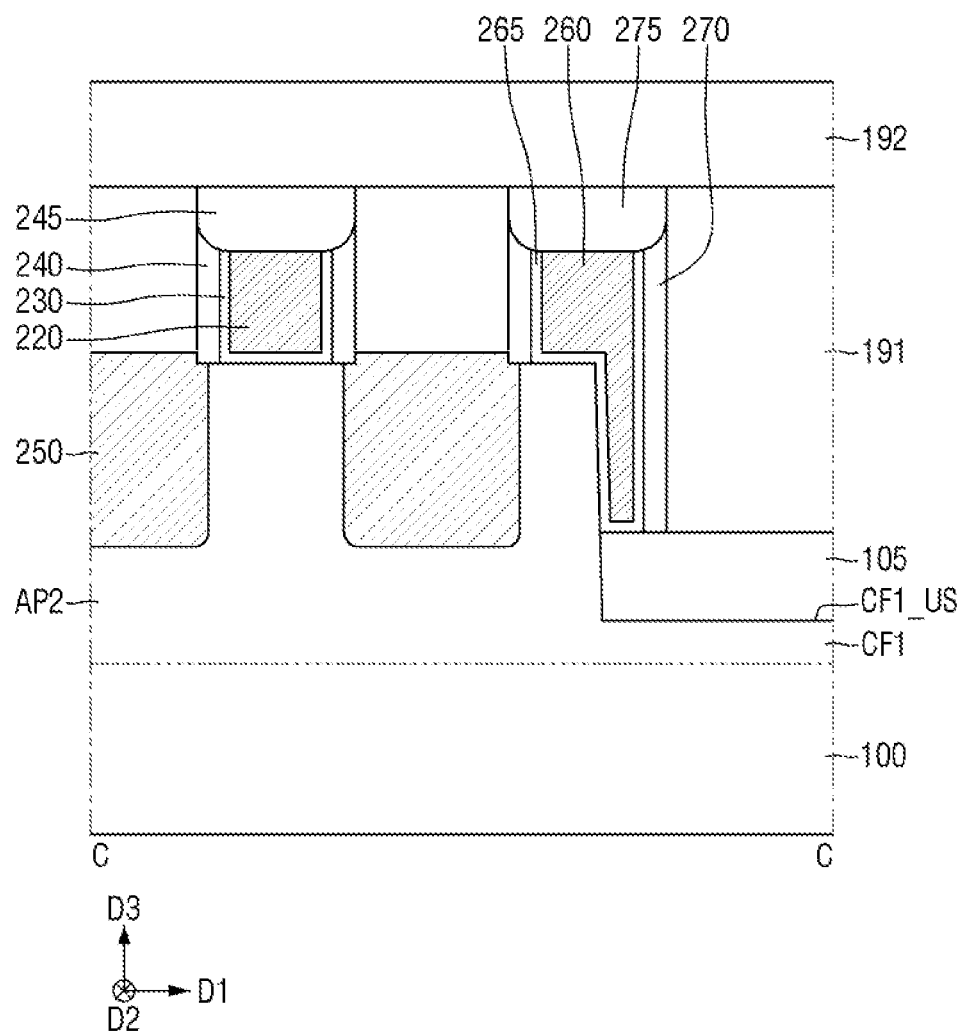

In the fabricating process, by etching a part of a pre-active pattern having a shape the same as those of the first multi-channel active pattern AP1 and the second multi-channel active pattern AP2, the first connecting fin type pattern CF1, the second connecting fin type pattern CF2, and the third connecting fin type pattern CF3 may be formed. In FIGS. 4 and 5, the upper surface of the first multi-channel active pattern AP1 and the upper surface of the second multi-channel active pattern AP2 are higher than the upper surface CF1_US of the first connecting fin type pattern.

The width of the first and second multi-channel active patterns AP1 and AP2 in the second direction D2 decreases, as it goes away from the substrate 100 in the third direction D3. Accordingly, the width of the upper surface CF1_US of the first connecting fin type pattern, the width of the upper surface CF2_US of the second connecting fin type pattern, and the width of the upper surface CF3_US of the third connecting fin type pattern are each greater than the width of the upper surface of the first multi-channel active pattern AP1 and the width of the upper surface of the second multi-channel active pattern AP2, respectively. The first connecting fin type pattern CF1 has two upper surfaces CF1_US adjacent to the first element region DRG1, with one for the first branch portion CF1_BP1 and one for the second branch portion CF1_BP2, and two upper surfaces CF1_US adjacent to the second element region DRG2, with one for the third branch portion CF1_BP3 and one for the fourth branch portion CF1_BP4. On the other hand, when the first multi-channel active pattern AP1 and the second multi-channel active pattern AP2 are measured at a height the same as those of the upper surfaces of the first to third connecting fin type patterns CF1, CF2 and CF3, the width of the upper surface CF1_US of the first connecting fin type pattern, the width of the upper surface CF2_US of the second connecting fin type pattern, and the width of the upper surface CF3_US of the third connecting fin type pattern may be the same as the width of the first multi-channel active pattern AP1 and the width of the second multi-channel active pattern AP2.

In an embodiment of the present disclosure, a boundary portion between the second connecting fin type pattern CF2 and the first multi-channel active pattern AP1, and a boundary portion between the third connecting fin type pattern CF3 and the first multi-channel active pattern AP1 may be similar to that of FIG. 4. In addition, a boundary portion between the second connecting fin type pattern CF2 and the second multi-channel active pattern AP2, and a boundary portion between the third connecting fin type pattern CF3 and the second multi-channel active pattern AP2 may be similar to that of FIG. 5.

A point where a step occurs between the first multi-channel active pattern AP1 and the connecting fin type patterns CF1, CF2 and CF3 may be a boundary between the first element region DRG1 and the connecting region CRG. A point where a step occurs between the second multi-channel active pattern AP2 and the connecting fin type patterns CF1, CF2 and CF3 may be a boundary between the second element region DRG2 and the connecting region CRG. In the fabricating process, a part of a pre-active pattern having a shape the same as those of the first multi-channel active pattern AP1 and the second multi-channel active pattern AP2 may be etched to form the step between the first multi-channel active pattern AP1 and one of the connecting fin type patterns CF1, CF2 and CF3 as the boundary between the first element region DRG1 and the connecting region CRG, and to form the step between the second multi-channel active pattern AP2 and the one of the connecting fin type patterns CF1, CF2 and CF3 as the boundary between the second element region DRG2 and the connecting region CRG.

A field insulating film 105 may be placed on the substrate 100, and may be formed over the first element region DRG1, the second element region DRG2, and the connecting region CRG.

The field insulating film 105 may fill a part of the first fin trench FT1 and the second fin trench FT2, and may be formed on a part of the side wall of the first multi-channel active pattern AP1 and a part of the side wall of the second multi-channel active pattern AP2. The first multi-channel active pattern AP1 and the second multi-channel active pattern AP2 each protrude upward from the upper surface of the field insulating film 105.

The field insulating film 105 may be placed on the first connecting fin type pattern CF1, the second connecting fin type pattern CF2, and the third connecting fin type pattern CF3, and may cover the upper surface CF1_US of the first connecting fin type pattern, the upper surface CF2_US of the second connecting fin type pattern, and the upper surface CF3_US of the third connecting fin type pattern. In addition, the field insulating film 105 may cover sidewalls of the first connecting fin type pattern CF1, the second connecting fin type pattern CF2, and the third connecting fin type pattern CF3. The first connecting fin type pattern CF1, the second connecting fin type pattern CF2, and the third connecting fin type pattern CF3 each does not protrude upward from the upper surface of each field insulating film 105.

The field insulating film 105 may include, for example, an oxide film, a nitride film, an oxynitride film or a combination film thereof.

The first gate electrode 120 may be placed on the first element region DRG1 of the substrate 100, and may be placed on the field insulating film 105. The first gate electrode 120 may intersect at least one or more first multi-channel active patterns AP1, and may extend long in the second direction D2.

The second gate electrode 220 may be placed on the second element region DRG2 of the substrate 100, and may be placed on the field insulating film 105. The second gate electrode 220 may intersect at least one or more second multi-channel active patterns AP2, and may extend long in the second direction D2.

A first edge gate electrode 160 may be placed along the boundary between the first element region DRG1 and the connecting region CRG, and may wrap around the end of the first multi-channel active pattern AP1. The first edge gate electrode 160 may intersect a plurality of first multi-channel active patterns AP1. The first edge gate electrode 160 may extend long in the second direction D2, and may be spaced apart from the first gate electrode 120 in the first direction D1.

A second edge gate electrode 260 may be placed along the boundary between the second element region DRG2 and the connecting region CRG, and may wrap around the end of the second multi-channel active pattern AP2. The second edge gate electrode 260 may intersect the plurality of second multi-channel active patterns AP2. The second edge gate electrode 260 may extend long in the second direction D2, and may be spaced apart from the second gate electrode 220 in the first direction D1.

Unlike that shown, the semiconductor device according to an embodiment of the present disclosure may not include the first edge gate electrode 160 and the second edge gate electrode 260. Although the single first edge gate electrode 160 is shown as being placed along the boundary between the first element region DRG1 and the connecting region CRG, the present disclosure is not limited thereto. Although the single second edge gate electrode 260 is shown as being placed along the boundary between the second element region DRG2 and the connecting region CRG, the present disclosure is not limited thereto.

In FIG. 1, the shape in which the first gate electrode 120 and the second gate electrode 220 are placed is merely an example, and the present disclosure is not limited thereto.

The first gate electrode 120, the second gate electrode 220, the first edge gate electrode 160 and the second edge gate electrode 260 may each include a conductive material, and may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

In addition to the conductive material described above, each of the first gate electrode 120, the second gate electrode 220, the first edge gate electrode 160, and the second edge gate electrode 260 may include a conductive metal oxide, a conductive metal oxynitride, and/or the like.

The first gate spacer 140 may be placed on the side wall of the first gate electrode 120. The second gate spacer 240 may be placed on the side wall of the second gate electrode 220. The first edge gate spacer 170 may be placed on the side wall of the first edge gate electrode 160. The second edge gate spacer 270 may be placed on the side wall of the second edge gate electrode 260. The first gate spacer 140, the second gate spacer 240, the first edge gate spacer 170 and the second edge gate spacer 270 may each extend in the second direction D2.

The first gate spacer 140, the second gate spacer 240, the first edge gate spacer 170 and the second edge gate spacer 270 may have a single-layered or multi-layered structure, and may include, for example, at least one of silicon nitride ($Si_3N_4$), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), or combinations thereof.

A first gate insulating film 130 may extend along the side wall and bottom surface of the first gate electrode 120. A second gate insulating film 230 may extend along the side wall and bottom surface of the second gate electrode 220. A first edge gate insulating film 165 may extend along the side wall and bottom surface of the first edge gate electrode 160. A second edge gate insulating film 265 may extend along the side wall and bottom surface of the second edge gate electrode 260. In FIGS. 6 and 7, the first and second gate insulating films 130 and 230 may extend along the upper surface of the field insulating film 105.

Taking the first gate insulating film 130 as an example, the first gate insulating film 130 may be formed along a profile of the first multi-channel active pattern AP1 protruding upward from the field insulating film 105, and along the upper surface of the field insulating film 105. In an embodiment of the present disclosure, the first gate insulating film 130 may include an interface film along the profile of the first multi-channel active pattern AP1 and the profile of the second multi-channel active pattern AP2 protruding upward from the field insulating film 105. For example, the interface film may include, but is not limited to, silicon oxide ($SiO_2$). That is, the material of the interface film may vary, depending on the materials of the first multi-channel active pattern AP1 and the second multi-channel active pattern AP2.

The first gate insulating film 130, the second gate insulating film 230, the first edge gate insulating film 165, and the second edge gate insulating film 265 may each include, for example, silicon oxide ($SiO_2$), silicon oxynitride (SiON) or a high dielectric constant material having a dielectric constant higher than that of silicon oxide ($SiO_2$). The high dielectric constant material may include, for example, one or more selected from, for example, boron nitride (BN), hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and lead zinc niobate [$Pb(Zn_{1/3}Nb_{2/3})O_3$].

The semiconductor device according to an embodiment of the present disclosure may include an NC (Negative Capacitance) FET using a negative capacitor. For example, the first gate insulating film 130, the second gate insulating film 230, the first edge gate insulating film 165, and the second edge gate insulating film 265 may each include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each of the individual capacitors. For example, the sum of the capacitances of the two or more capacitors is less than the capacitance of each individual capacitor. On the other hand, when at least one of the capacitances of two or more capacitors connected in series has a negative value, the entire capacitance may have a positive value and may be greater than an absolute value of each of the individual capacitances.

When the ferroelectric material film having the negative capacitance and the paraelectric material film having the positive capacitance are connected in series, the entire capacitance values of the ferroelectric material film and the paraelectric material film connected in series may increase. Taking advantage of the increased overall capacitance value, a transistor including the ferroelectric material film may have a subthreshold swing (SS) below 60 mV/decade at room temperature. For example, in a negative capacitance FET (NC-FET), the insulating ferroelectric material layer served as a negative capacitor so that channel surface potential can be amplified more than the gate voltage, and hence the device can operate with SS less than 60 mV/decade at room temperature.

The ferroelectric material film may have ferroelectric properties. The ferroelectric material film may include, for example, at least one of hafnium oxide ($HfO_2$), hafnium zirconium oxide ($HfZrO_4$), barium strontium titanium oxide ($BaSrTi_2O_6$), barium titanium oxide ($BaTiO_3$), or lead zirconium titanium oxide ($Pb(Ti,Zr)O_3$). Each of the ferroelectric materials described above, the ratio between metals may vary and the composition may be nonstoichiometric. For example, the hafnium zirconium oxide may be a material obtained by doping hafnium oxide ($HfO_2$) with zirconium (Zr). For example, the hafnium zirconium oxide may be a compound of hafnium (Hf), zirconium (Zr), and oxygen (O). In other words, hafnium zirconium oxide may be represented by $Hf_xZr_yO_z$ with various combinations of numerical values of x, y and z instead of being represented by $HfZrO_4$.

The ferroelectric material film may further include a doped dopant. For example, the dopant may include at least one of, for example, aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide ($HfO_2$), the dopant included in the ferroelectric material film may include, for example, at least one of gadolinium (Gd), silicon (Si), zirconium (Zr), aluminum (Al), or yttrium (Y). However, the present disclosure is not limited thereto. For example, other dopants such as, for example, strontium (Sr), lanthanum (La), titanium (Ti) and tantalum (Ta) may also be used to dope the ferroelectric material layer including hafnium oxide ($HfO_2$).

When the dopant is aluminum (Al), the ferroelectric material film may include 3 to 8 at % (atomic %) aluminum (Al). Here, a ratio of the dopant may be a ratio of aluminum (Al) to the sum of hafnium (Hf) and aluminum (Al).

When the dopant is silicon (Si), the ferroelectric material film may include about 2 to about 10 at % silicon (Si). When the dopant is yttrium (Y), the ferroelectric material film may include about 2 to about 10 at % yttrium (Y). When the dopant is gadolinium (Gd), the ferroelectric material film may include about 1 to about 7 at % gadolinium (Gd). When the dopant is zirconium (Zr), the ferroelectric material film may include about 50 to about 80 at % zirconium (Zr).

The paraelectric material film may have paraelectric properties. The paraelectric material film may include, for example, a silicon oxide ($SiO_2$) and/or a metal oxide having a high dielectric constant. The metal oxide included in the paraelectric material film may include, but is not limited to, for example, at least one of hafnium oxide ($HfO_2$), barium strontium titanium oxide ($BaSrTi_2O_6$), zirconium oxide ($ZrO_2$), or aluminum oxide ($Al_2O_3$).

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide ($HfO_2$), a crystal structure of hafnium oxide ($HfO_2$) included in the ferroelectric material film is different from a crystal structure of hafnium oxide ($HfO_2$) included in the paraelectric material film.

The ferroelectric material film may have a thickness having the ferroelectric properties. A thickness of the ferroelectric material film may be, but is not limited to, for example, in a range from about 0.5 to about 10 nm. Since a critical thickness that exhibits the ferroelectric properties may vary for each ferroelectric material, the thickness of the ferroelectric material film may vary depending on the type of ferroelectric material.

In an embodiment of the present disclosure, the first gate insulating film 130, the second gate insulating film 230, the first edge gate insulating film 165, and the second edge gate insulating film 265 may each include a single ferroelectric material film, but the present disclosure is not limited thereto. For example, the first gate insulating film 130, the second gate insulating film 230, the first edge gate insulating film 165, and the second edge gate insulating film 265 may each include a plurality of ferroelectric material films spaced apart from each other. The first gate insulating film 130, the second gate insulating film 230, the first edge gate insulating film 165, and the second edge gate insulating film 265 may each have a stacked film structure in which a plurality of ferroelectric material films and a plurality of paraelectric material films are alternately stacked.

The first gate capping pattern 145, the second gate capping pattern 245, the first edge gate capping pattern 175 and the second edge gate capping pattern 275 may be placed on the upper surfaces of the first gate electrode 120, the second gate electrode 220, the first edge gate electrode 160 and the second edge gate electrode 260, respectively. Taking the first gate capping pattern 145 as an example, the first gate capping pattern 145 may be placed on the upper surface of the first gate spacer 140. The first gate capping pattern 145, the second gate capping pattern 245, the first edge gate capping pattern 175 and the second edge gate capping pattern 275 may include, for example, at least one of silicon nitride ($Si_3N_4$), silicon oxynitride (SiON), silicon oxide ($SiO_2$), silicon carbonitride (SiCN), silicon oxycarbonitride (SiOCN), or combinations thereof.

Unlike that shown, taking the first gate capping pattern 145 as an example, the first gate capping pattern 145 may be placed between the first gate spacers 140. In such a case, the upper surface of the first gate capping pattern 145 may be placed on a plane the same as that of the upper surface of the first gate spacer 140.

Unlike that shown, the first gate capping pattern 145, the second gate capping pattern 245, the first edge gate capping pattern 175, and the second edge gate capping pattern 275 may not be placed on the first gate electrode 120, the second gate electrode 220, the first edge gate electrode 160 and the second edge gate electrode 260, respectively.

A first source/drain pattern 150 may be formed on the first multi-channel active pattern AP1, and may be placed on either side of the first gate electrode 120. The first source/drain pattern 150 may include a p-type impurity or an n-type impurity.

A second source/drain pattern 250 may be formed on the second multi-channel active pattern AP2, and may be placed on either side of the second gate electrode 220. The second source/drain pattern 250 may include a p-type impurity or an n-type impurity.

The first source/drain pattern 150 and the second source/drain pattern 250 may each include, but are not limited to, an epitaxial pattern formed through an epitaxial process. For example, in an embodiment of the present disclosure, the first source/drain patterns 150 may be formed by performing an epitaxial growth process in recessed regions of the first multi-channel active pattern AP1 on both sides of the first gate electrode 120. The second source/drain patterns 250 may be formed by performing an epitaxial growth process in recessed regions of the second multi-channel active pattern AP2 on both sides of the second gate electrode 220. The first source/drain pattern 150 may be included in a source/drain of a transistor that uses the first multi-channel active pattern AP1 as a channel region, and the second source/drain pattern 250 may be included in a source/drain of a transistor that uses the second multi-channel active pattern AP2 as a channel region.

A lower interlayer insulating film 191 is formed on the field insulating film 105 and may cover the first source/drain pattern 150 and the second source/drain pattern 250. The lower interlayer insulating film 191 may be formed around the first gate electrode 120, the second gate electrode 220, the first edge gate electrode 160, and the second edge gate electrode 260. In an embodiment of the present disclosure, an upper surface of the lower interlayer insulating film 191 may be coplanar with upper surfaces of the first gate capping pattern 145, the second gate capping pattern 245, the first edge gate capping pattern 175, and the second edge gate capping pattern 275, but the present disclosure is not limited thereto.

An upper interlayer insulating film 192 may be placed on the lower interlayer insulating film 191. In an embodiment of the present disclosure, a wiring pattern connected to the gate electrodes 120 and 220 and the source/drain patterns 150 and 250 may be placed inside the upper interlayer insulating film 192.

The upper interlayer insulating film 192 and the lower interlayer insulating film 191 may each include, for example, at least one of silicon oxide ($SiO_2$), silicon nitride ($Si_3N_4$), silicon oxynitride (SiON), or a low dielectric constant material. The low dielectric constant material may include, but is not limited to, for example, fluorinated tetraethyl orthosilicate (FTEOS), hydrogen silsesquioxane (HSQ), bisbenzocyclobutene (BCB), tetramethyl orthosilicate (TMOS), octamethylcyclotetrasiloxane (OMCTS), hexamethyldisiloxane (HMDS), tris(trimethylsilyl) borate (TMSB), diacetoxyditertiarybutosiloxane (DADBS), tris(trimethylsilyl) phosphate (TMSP), polytetrafluoroethylene (PTFE), tonen silazene (TOSZ), fluorosilicate glass (FSG), polyimide nanofoams such as polypropylene oxide, carbon-doped silicon oxide (CDO), organosilicate glass (OSG), SILK, amorphous fluorinated carbon (a-$CF_x$), silica aerogels, silica xerogels, mesoporous silica, or combinations thereof.

FIGS. 8A to 10 are diagrams for explaining a semiconductor device according to an embodiment of the present disclosure. For convenience of explanation, differences from those described with reference to FIGS. 1 to 7 will be mainly described.

Figure 8A:
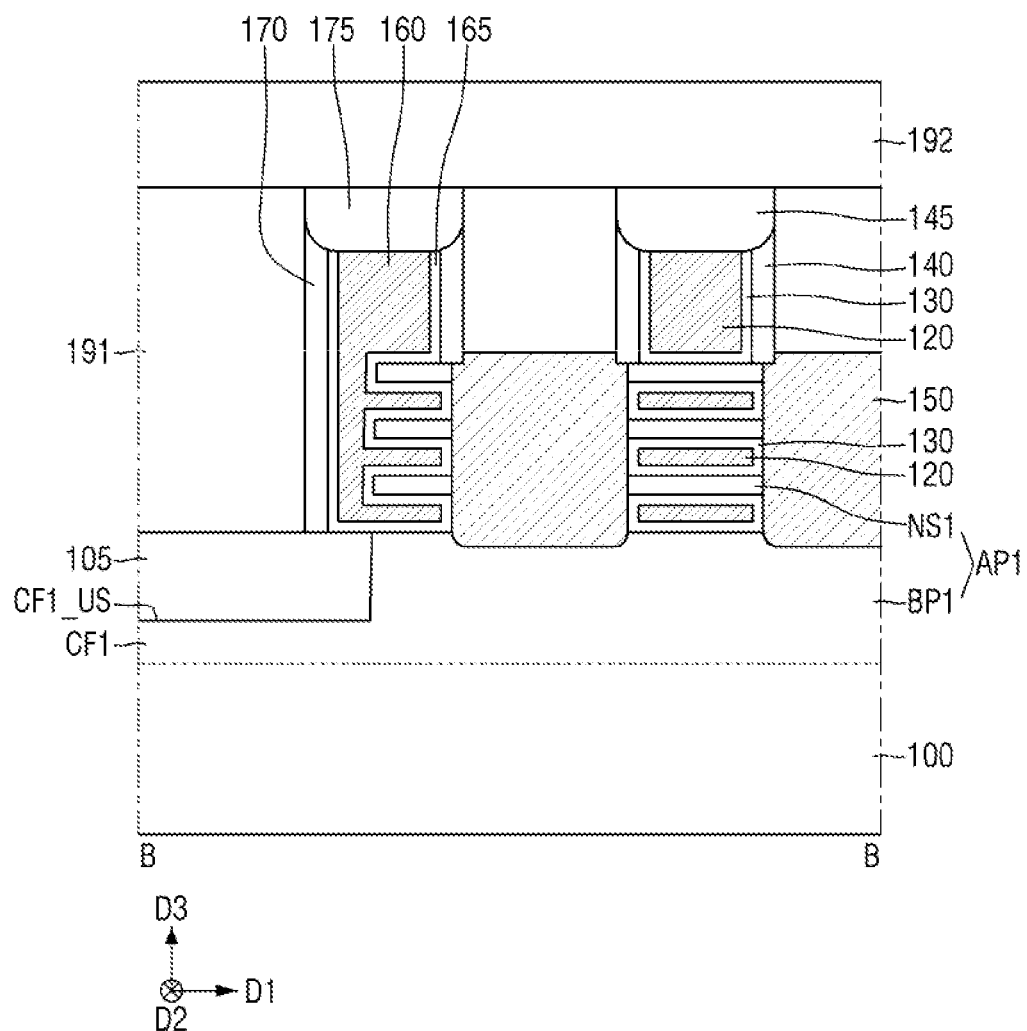
FIGS. 8A, 8B, 9A, 9B and 10 are diagrams for explaining the semiconductor device according to an embodiment of the present disclosure.
Figure 8B:
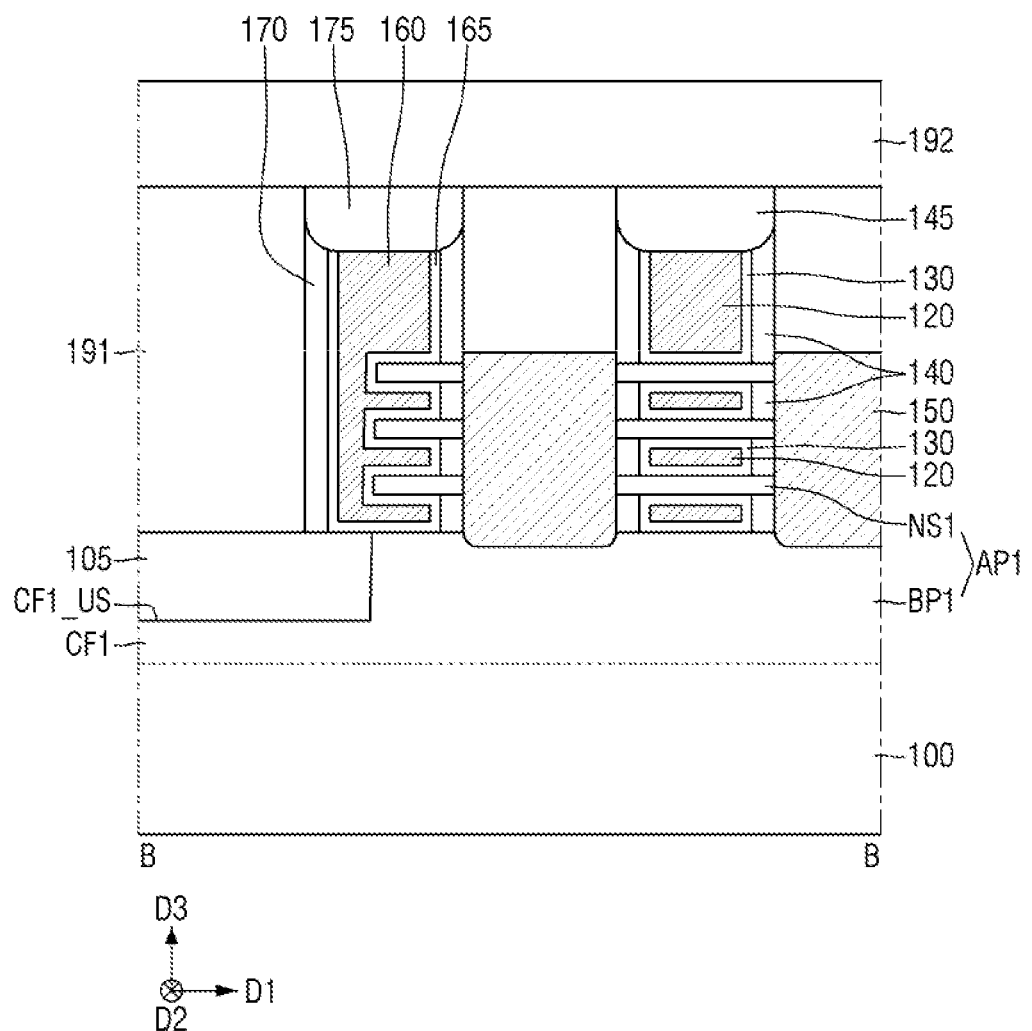
Figure 9A:
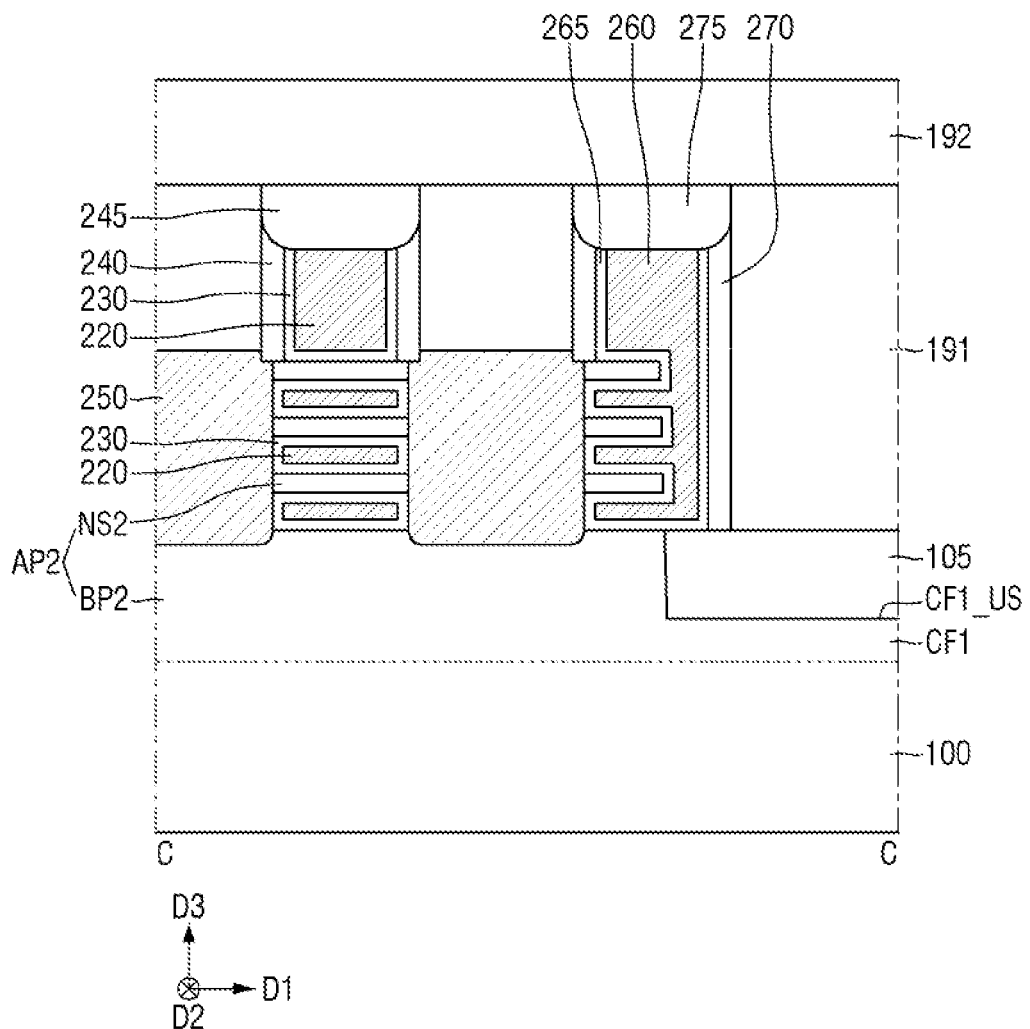
Figure 9B:
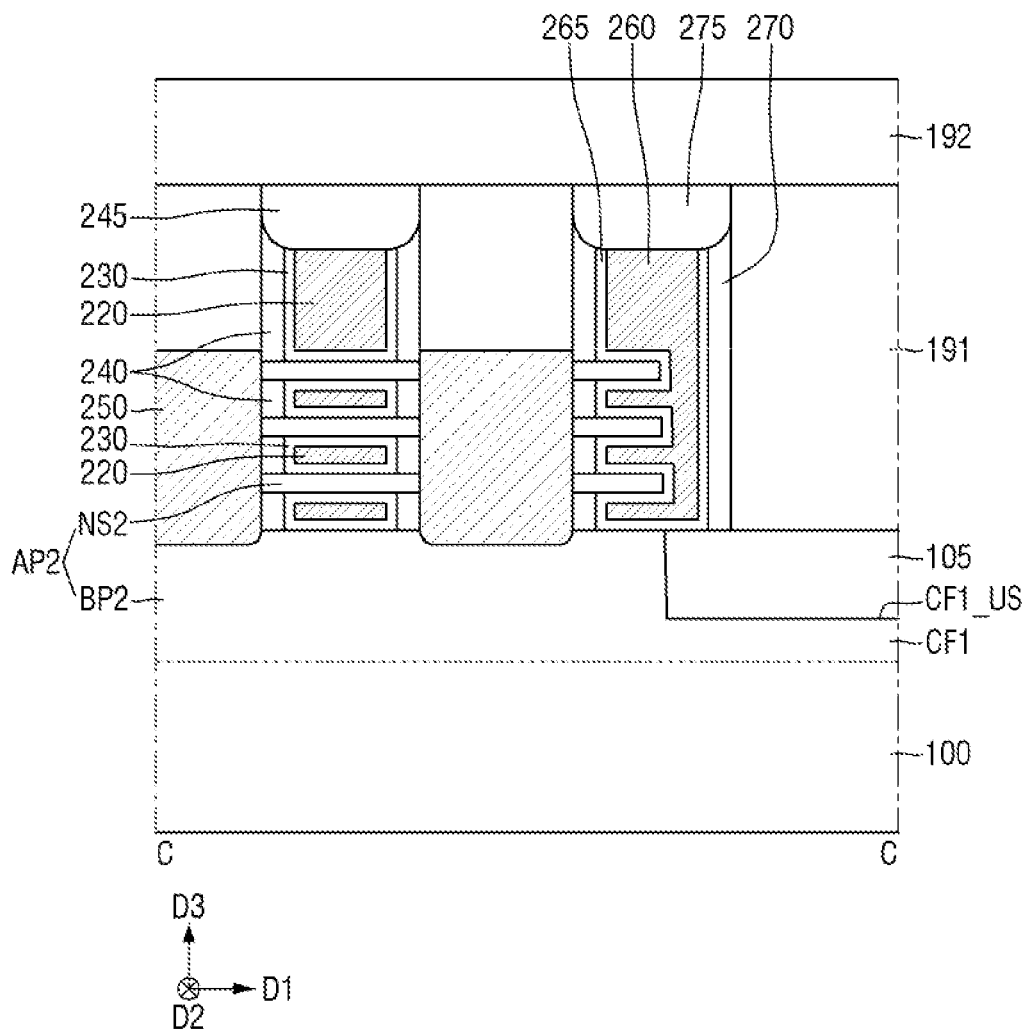
Figure 10:
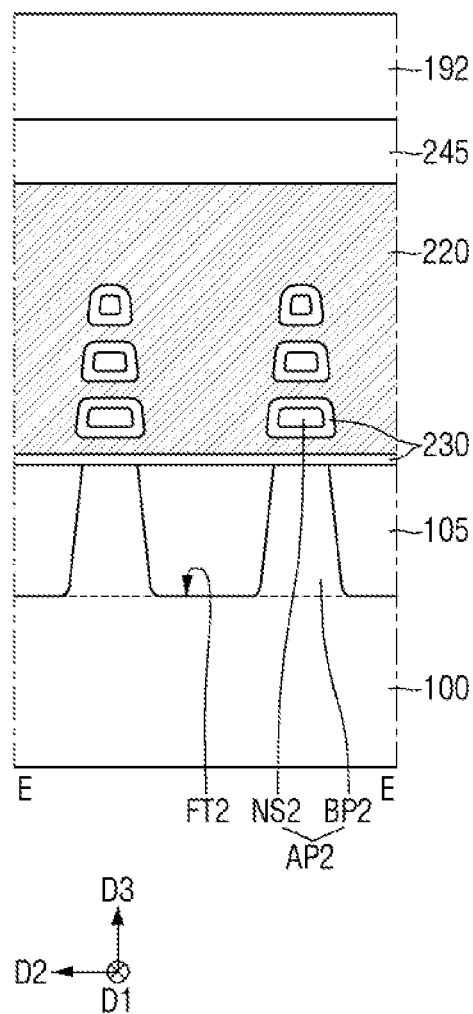

For reference, FIGS. 8A and 8B are exemplary diagrams taken along B-B of FIG. 1. FIGS. 9A and 9B are exemplary diagrams taken along C-C of FIG. 1. FIG. 10 is an exemplary diagram taken along E-E of FIG. 1. A cross-sectional view taken along D-D of FIG. 1 may have a shape substantially the same as that of FIG. 10.

In the semiconductor device to be described below, a transistor including nanosheets may be formed in the first element region DRG1 and the second element region DRG2.

Referring to FIGS. 8A to 10, in the semiconductor device according to an embodiment of the present disclosure, the first multi-channel active pattern AP1 may include a first lower fin type pattern BP1 and a first sheet pattern NS1. The second multi-channel active pattern AP2 may include a second lower fin type pattern BP2 and a second sheet pattern NS2.

The first lower fin type pattern BP1 may extend along the first direction D1. The first sheet pattern NS1 may be placed on the first lower fin type pattern BP1 to be spaced apart from the first lower fin type pattern BP1. The first lower fin type pattern BP1 may be formed by etching a portion of the substrate 100 and/or may include an epitaxial layer grown from the substrate 100. For example, the first lower fin type pattern BP1 may be formed by partially removing an upper portion of the substrate 100, and thus may be integrally formed with the substrate 100, but the present disclosure is not limited thereto.

The second lower fin type pattern BP2 may extend along the first direction D1. The second sheet pattern NS2 may be placed on the second lower fin type pattern BP2 to be spaced apart from the second lower fin type pattern BP2. The second lower fin type pattern BP2 may be formed by etching a portion of the substrate 100 and/or may include an epitaxial layer grown from the substrate 100. For example, the second lower fin type pattern BP2 may be formed by partially removing an upper portion of the substrate 100, and thus may be integrally formed with the substrate 100, but the present disclosure is not limited thereto.

The first sheet pattern NS1 and the second sheet pattern NS2 may each include a pattern of a plurality of sheets stacked in the third direction D3. Although the number of each of the first sheet patterns NS1 and the second sheet patterns NS2 is shown as three, this is only for convenience of explanation, and the number thereof is not limited thereto. For example, the number of first sheet patterns NS1 included in the first multi-channel active pattern AP1 may be two or more than three.

The first sheet pattern NS1 may be connected to the first source/drain pattern 150. The second sheet pattern NS2 may be connected to the second source/drain pattern 250. The first sheet pattern NS1 and the second sheet pattern NS2 may be a channel pattern used as a channel region of a transistor. For example, the first sheet pattern NS1 and the second sheet pattern NS2 may be nanosheets or nanowires.

The first lower fin type pattern BP1 and the second lower fin type pattern BP1 include at least one of each elemental semiconductor material, a group IV-IV compound semiconductor material or a group III-v compound semiconductor material. The first sheet pattern NS1 and the second sheet pattern NS2 may each include one of the elemental semiconductor material, the group IV-IV compound semiconductor material or the group III-v compound semiconductor material.

The second gate insulating film 230 may extend along the upper surface of the second lower fin type pattern BP2 and the upper surface of the field insulating film 105. The second gate insulating film 230 may wrap around the second sheet pattern NS2. The second gate insulating film 230 is illustrated as being a single layer, but this is only for convenience of description, and the present disclosure is not limited thereto. The second gate insulating film 230 may include a plurality of layers. For example, the second gate insulating film 230 may also include an interface film disposed between second sheet pattern NS2 and the second gate electrode 220, in addition to a high dielectric constant insulating layer as described above. The first gate insulating film 130 may also be formed in a shape substantially the same as that of the second gate insulating film 230.

The second gate electrode 220 is placed on the second lower fin type pattern BP2 with the second gate insulating film 230 placed therebetween. The second gate electrode 220 intersects the second lower fin type pattern BP2. The second gate electrode 220 may wrap around the second sheet pattern NS2 with the second gate insulating film 230 placed therebetween, and may be placed between the second lower fin type pattern BP2 and the second sheet pattern NS2, and between the adjacent second sheet patterns NS2. The first gate electrode 120 may also be formed in a shape substantially the same as that of the second gate electrode 220.

In FIGS. 8A and 9A, the first gate spacer 140 is not placed between the first lower fin type pattern BP1 and the first sheet pattern NS1, and between the adjacent first sheet patterns NS1. The second gate spacer 240 is not placed between the second lower fin type pattern BP2 and the second sheet pattern NS2, and between the adjacent second sheet patterns NS2.

In FIGS. 8B and 9B, the first gate spacer 140 is placed between the first lower fin type pattern BP1 and the first sheet pattern NS1, and between the adjacent first sheet patterns NS1. The second gate spacer 240 is placed between the second lower fin type pattern BP2 and the second sheet pattern NS2, and between the adjacent second sheet patterns NS2.

Figure 11:
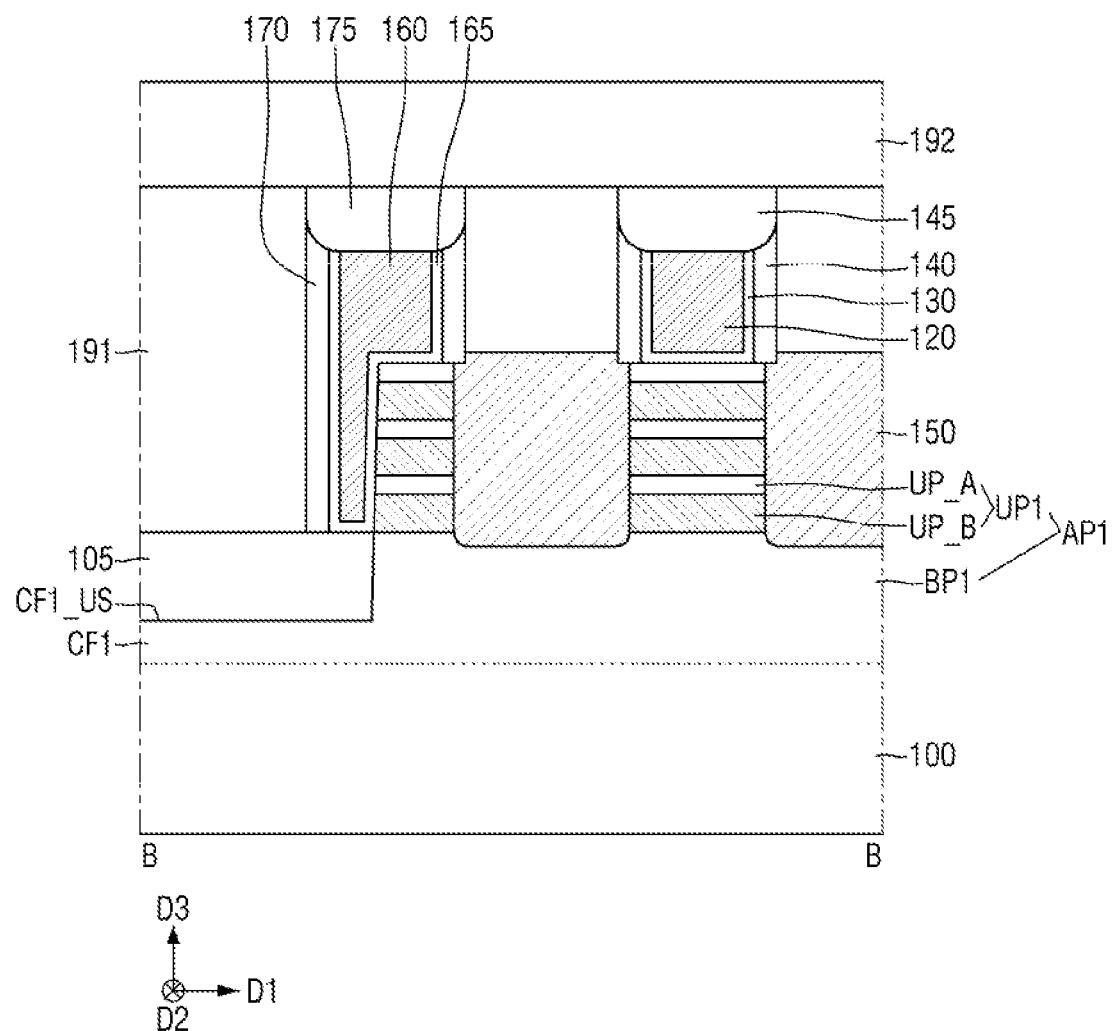
FIG. 11 is a diagram for explaining the semiconductor device according to an embodiment of the present disclosure.

FIG. 11 is a diagram for explaining a semiconductor device according to an embodiment of the present disclosure. For convenience of explanation, differences from those described with reference to FIGS. 1 and 8A to 10 will be mainly described.

For reference, the description of the second element region DRG2 of FIG. 1 is substantially the same as that described with reference to FIGS. 9A to 10.

In the semiconductor device to be described below, a fin type transistor (FinFET) including a fin type pattern-shaped channel region may be formed in the first element region DRG1, and a transistor including a nanosheet may be formed in the second element region DRG2.

Referring to FIG. 11, in the semiconductor device according to an embodiment of the present disclosure, the first multi-channel active pattern AP1 may include the first lower fin type pattern BP1 and the first upper fin type pattern UP1.

The first lower fin type pattern BP1 may extend along the first direction D1. The first upper fin type pattern UP1 may be directly connected to the first lower fin type pattern BP1. The first upper fin type pattern UP1 may include a first semiconductor mold pattern UP_A and a second semiconductor mold pattern UP_B which are alternately stacked on the first lower fin type pattern BP1.

The first semiconductor mold pattern UP_A may include a material the same as that of the second sheet pattern NS2 of FIGS. 9A to 10. If the second semiconductor mold pattern UP_B is removed during the fabricating process, the first semiconductor mold pattern UP_A may become the first sheet pattern NS1 of FIGS. 8A and 8B.

The first semiconductor mold pattern UP_A may be a silicon (Si) pattern, and the second semiconductor mold pattern UP_B may be a silicon-germanium (SiGe) pattern, but the present disclosure is not limited thereto.

The first upper fin type pattern UP1 may be connected to the first source/drain pattern 150, and may be used as a channel region of the transistor.

Figure 12:
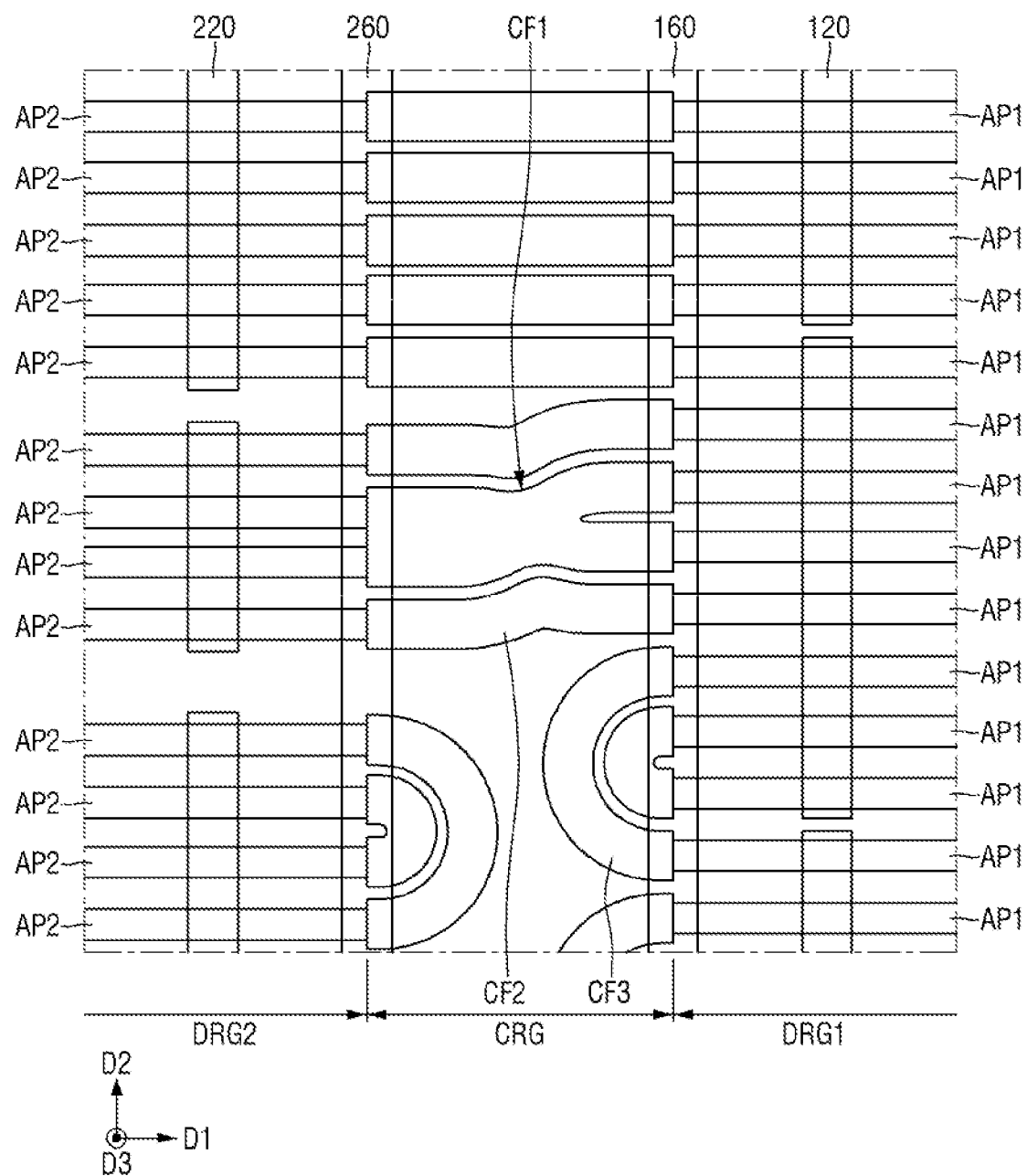
FIGS. 12 and 13 are diagrams for explaining the semiconductor device according to an embodiment of the present disclosure.
Figure 13:
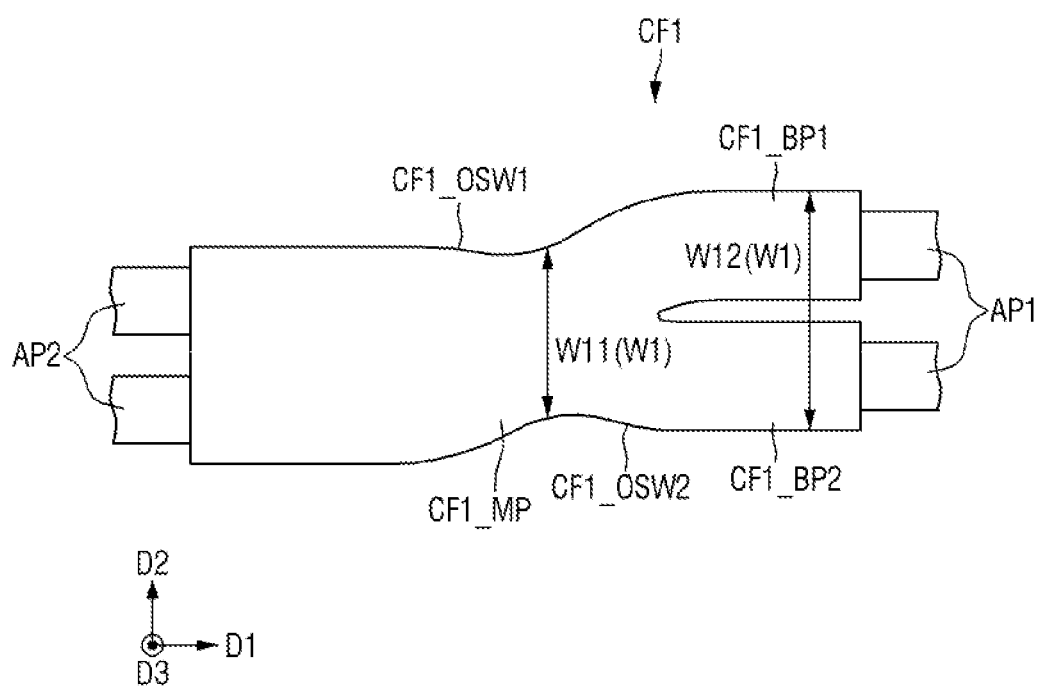

FIGS. 12 and 13 are diagrams for explaining a semiconductor device according to an embodiment of the present disclosure. For convenience of explanation, differences from those described with reference to FIGS. 1 to 7 will be mainly described.

For reference, FIG. 12 is an exemplary layout diagram for showing a semiconductor device according to an embodiment of the present disclosure. FIG. 13 is a diagram for explaining the first connecting fin type pattern of FIG. 12.

In FIGS. 12 and 13, in the semiconductor device according to an embodiment of the present disclosure, a bridge portion CF1_MP of the first connecting fin type pattern CF1 may extend to the second element region DRG2.

For example, an upper surface (CF1_US of FIG. 3) of the first connecting fin type pattern may have a "Y" shape.

A first outer side wall CF1_OSW1 of the first connecting fin type pattern may be a side wall of the first branch portion CF1_BP1 and the bridge portion CF1_MP. A second outer side wall CF1_OSW2 of the first connecting fin type pattern may be a side wall of the second branch portion CF1_BP2 and the bridge portion CF1_MP.

A width W1 of the bridge portion CF1_MP of the first connecting fin type pattern in the second direction D2 may decrease and then increase, as it goes away from the first branch portion CF1_BP1 and the second branch portion CF1_BP2.

In the semiconductor device according to an embodiment of the present disclosure, the bridge portion CF1_MP may be directly connected to two or less of the second multi-channel active patterns AP2. The first branch portion CF1_BP1 and the second branch portion CF1_BP2 may each be directly connected to one or less of the first multi-channel active pattern AP1.

Figure 14:
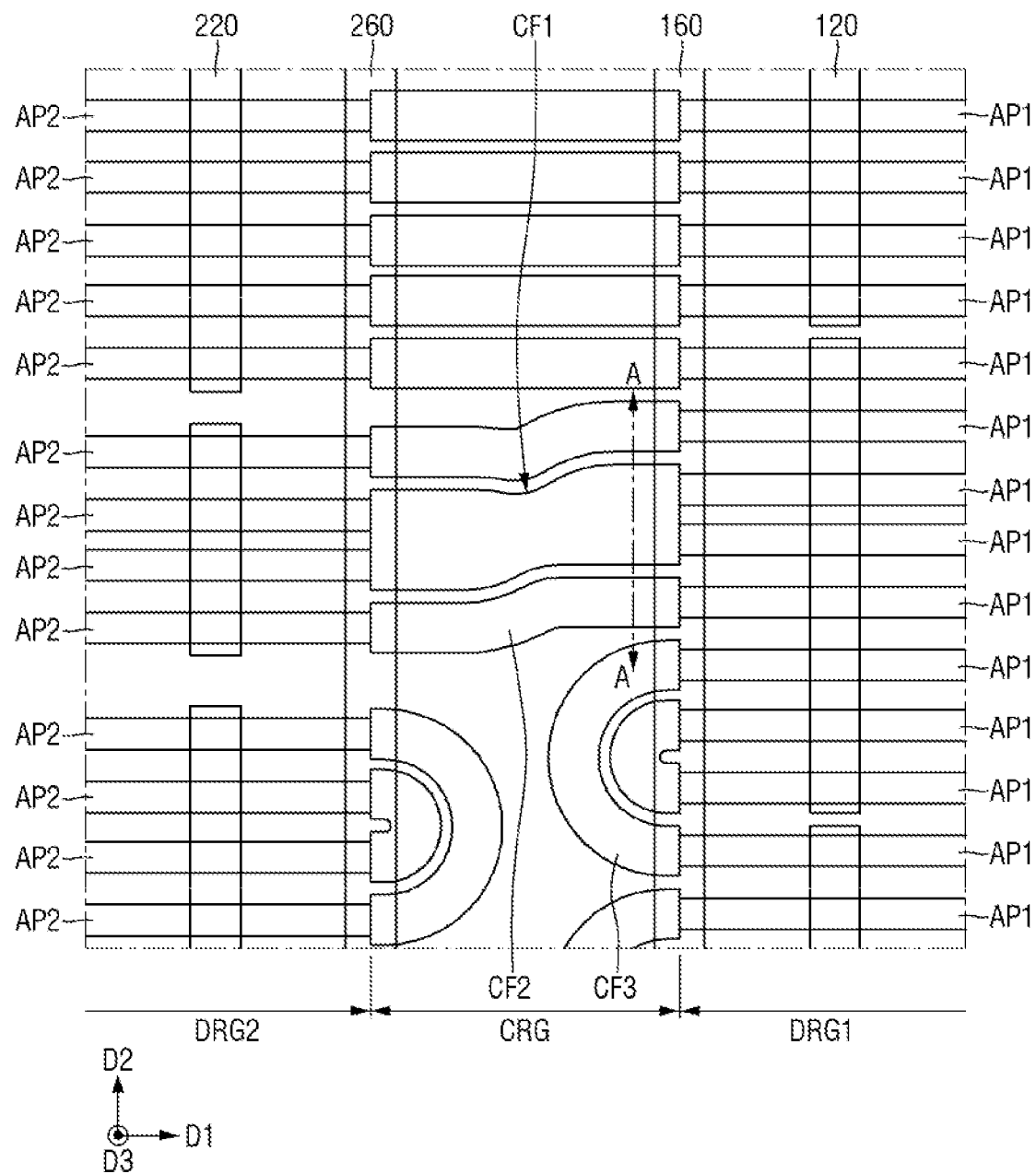
FIGS. 14 to 16 are diagrams for explaining the semiconductor device according to an embodiment of the present disclosure.
Figure 15:
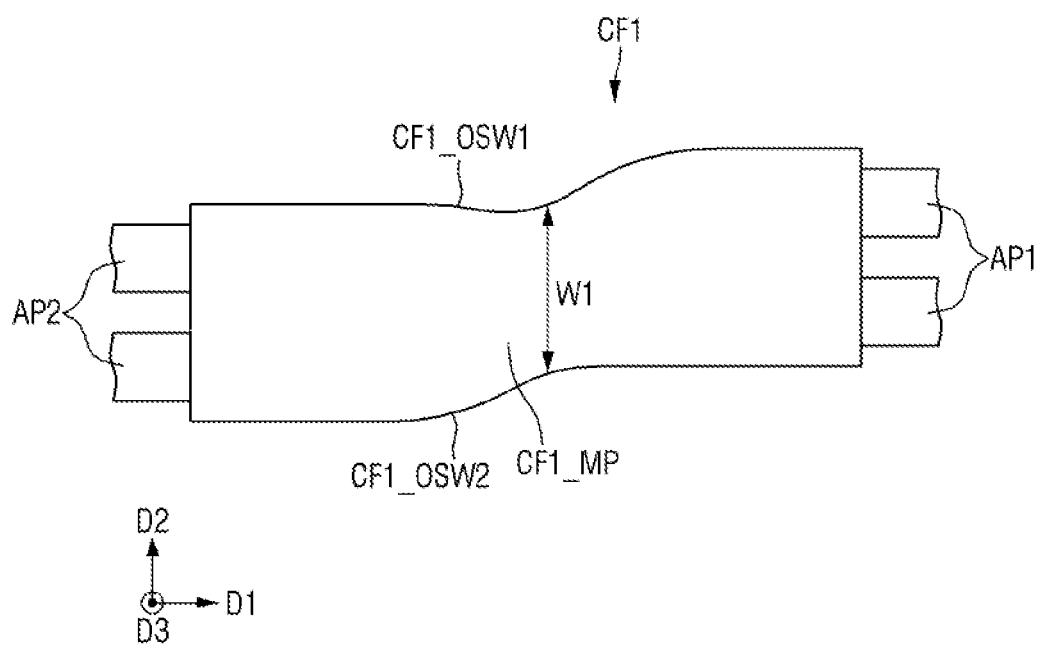
Figure 16:
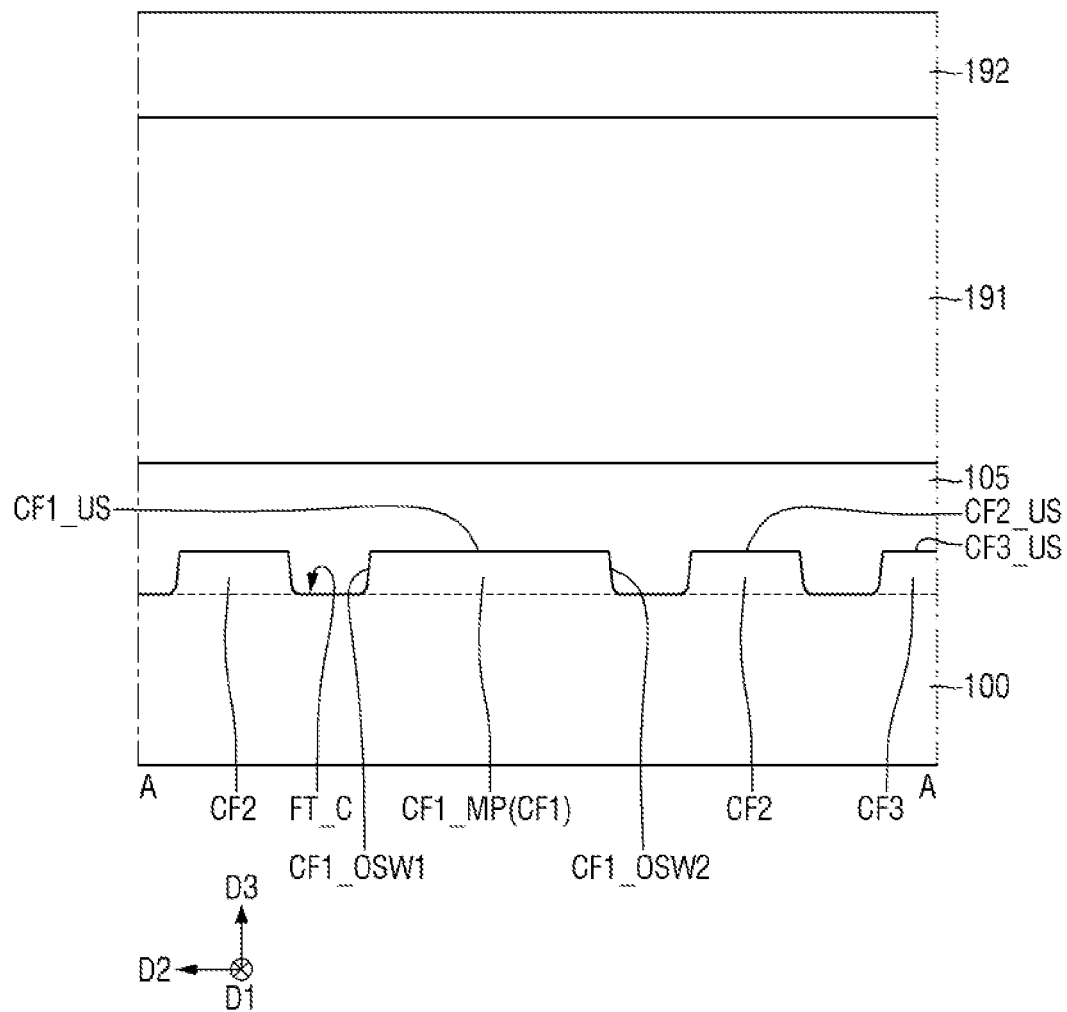

FIGS. 14 to 16 are diagrams for explaining a semiconductor device according to an embodiment of the present disclosure. For convenience of explanation, differences from those described with reference to FIGS. 1 to 7 will be mainly described.

For reference, FIG. 14 is an exemplary layout diagram for explaining a semiconductor device according to an embodiment of the present disclosure. FIG. 15 is a diagram for explaining a first connecting fin type pattern of FIG. 14. FIG. 16 is an exemplary cross section taken along A-A of FIG. 14.

Referring to FIGS. 14 to 16, in the semiconductor device according to an embodiment of the present disclosure, the bridge portion CF1_MP of the first connecting fin type pattern CF1 extends from the first element region DRG1 to the second element region DRG2. The first connecting fin type pattern CF1 does not include the branch portions (CF1_BP1, CF1_BP2, CF1_BP3, and CF1_BP4 of FIG. 2). For example, the entire first connecting fin type pattern CF1 is the bridge portion CF1_MP.

A first outer side wall CF1_OSW1 of the first connecting fin type pattern may be a side wall of the bridge portion CF1_MP. A second outer side wall CF1_OSW2 of the first connecting fin type pattern may be a side wall of the bridge portion CF1_MP.

The width W1 of the bridge portion CF1_MP of the first connecting fin type pattern in the second direction D2 may decrease and then increase, as it goes away from the first element region DRG1. The width W1 of the first connecting fin type pattern CF1 in the second direction D2 may be a width between the first outer side wall CF1_OSW1 of the first connecting fin type pattern and the second outer side wall CF1_OSW2 of the first connecting fin type pattern in the second direction D2.

In the semiconductor device according to an embodiment of the present disclosure, the bridge portion CF1_MP may be directly connected to two or less of the first multi-channel active patterns AP1. Further, the bridge portion CF1_MP may be directly connected to two or less of the second multi-channel active patterns AP2.

In FIG. 16, the width of the upper surface CF1_US of the first connecting fin type pattern is greater than the width of the upper surface CF2_US of the second connecting fin type pattern and the width of the upper surface CF3_US of the third connecting fin type pattern in the second direction D2. A second connecting fin type patterns CF2 each having a width narrower than that of the first connecting fin type pattern CF1 are placed on both sides of the first connecting fin type pattern CF1. For example, one first connecting fin type pattern CF1 is interposed between two second connecting fin type patterns CF2.

Figure 17:
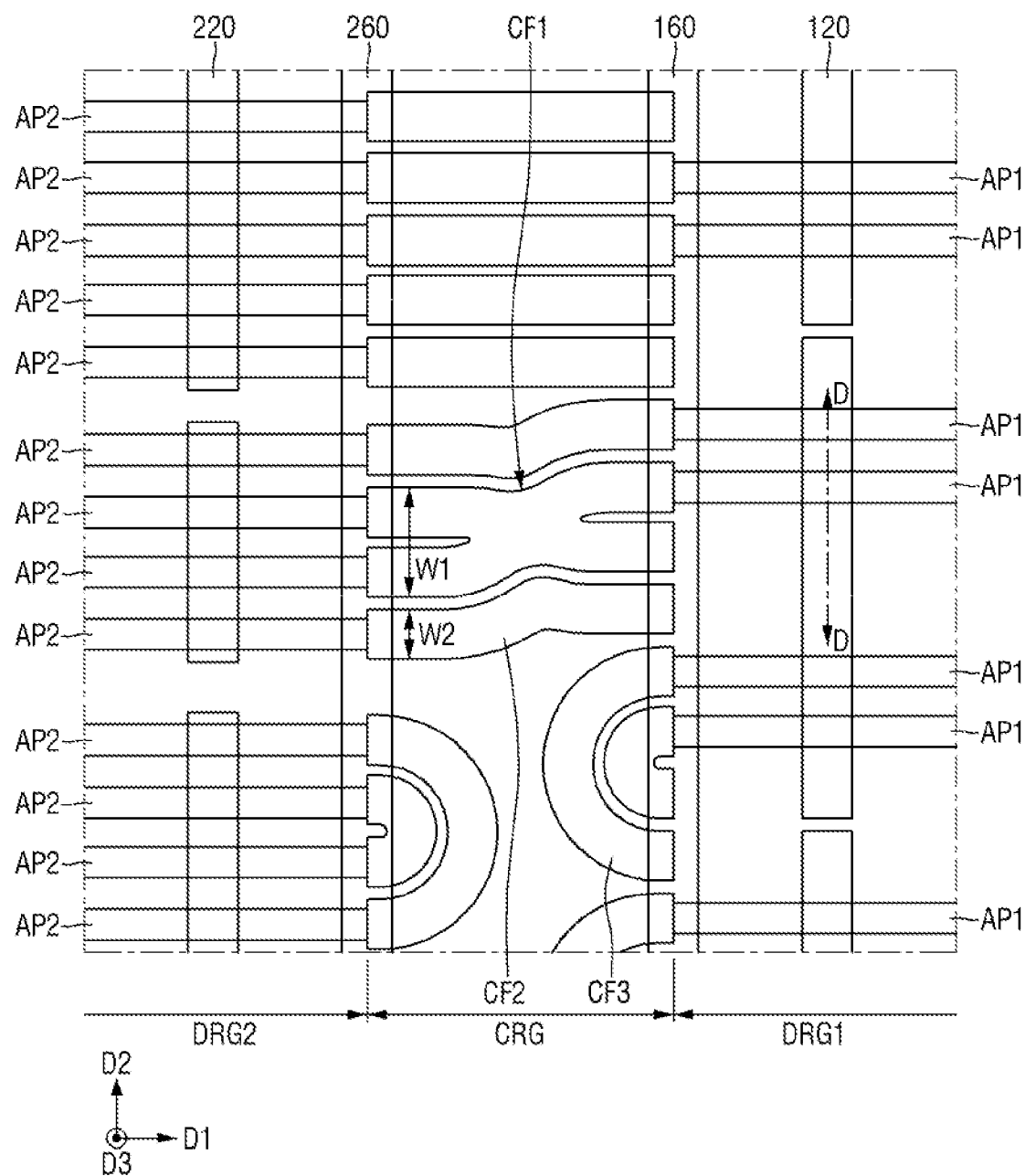
FIGS. 17 to 19 are diagrams for explaining the semiconductor device according to an embodiment of the present disclosure.
Figure 18:
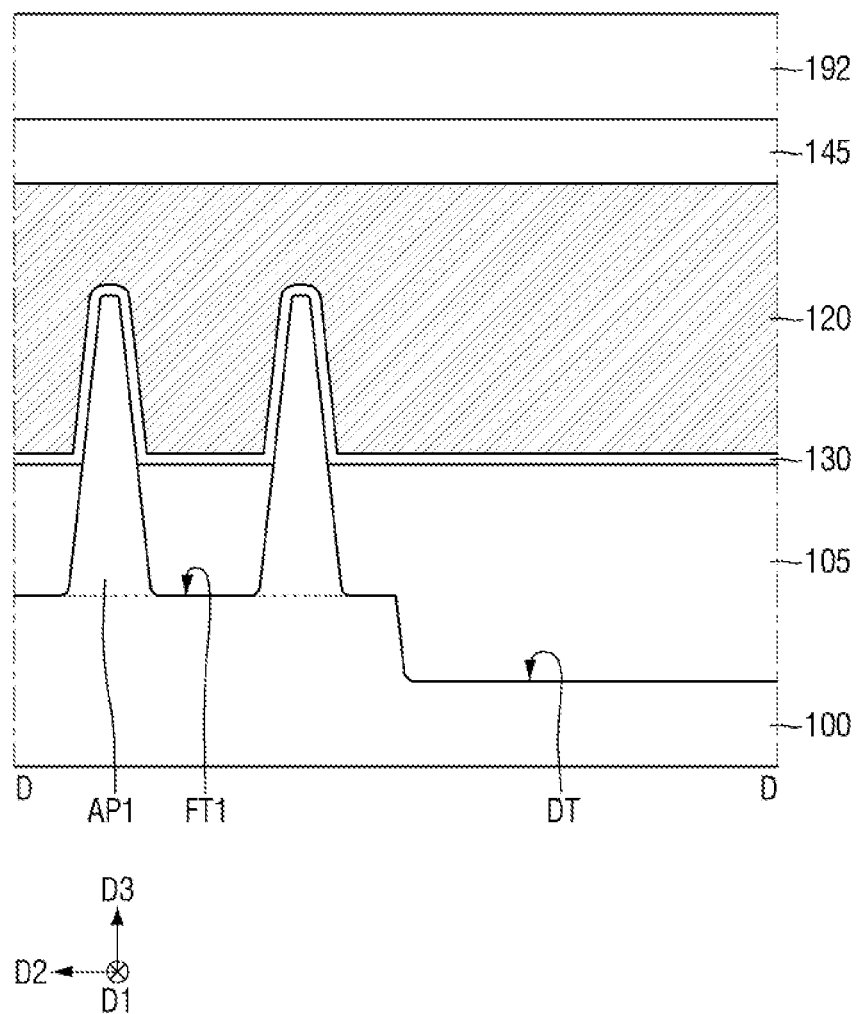
Figure 19:
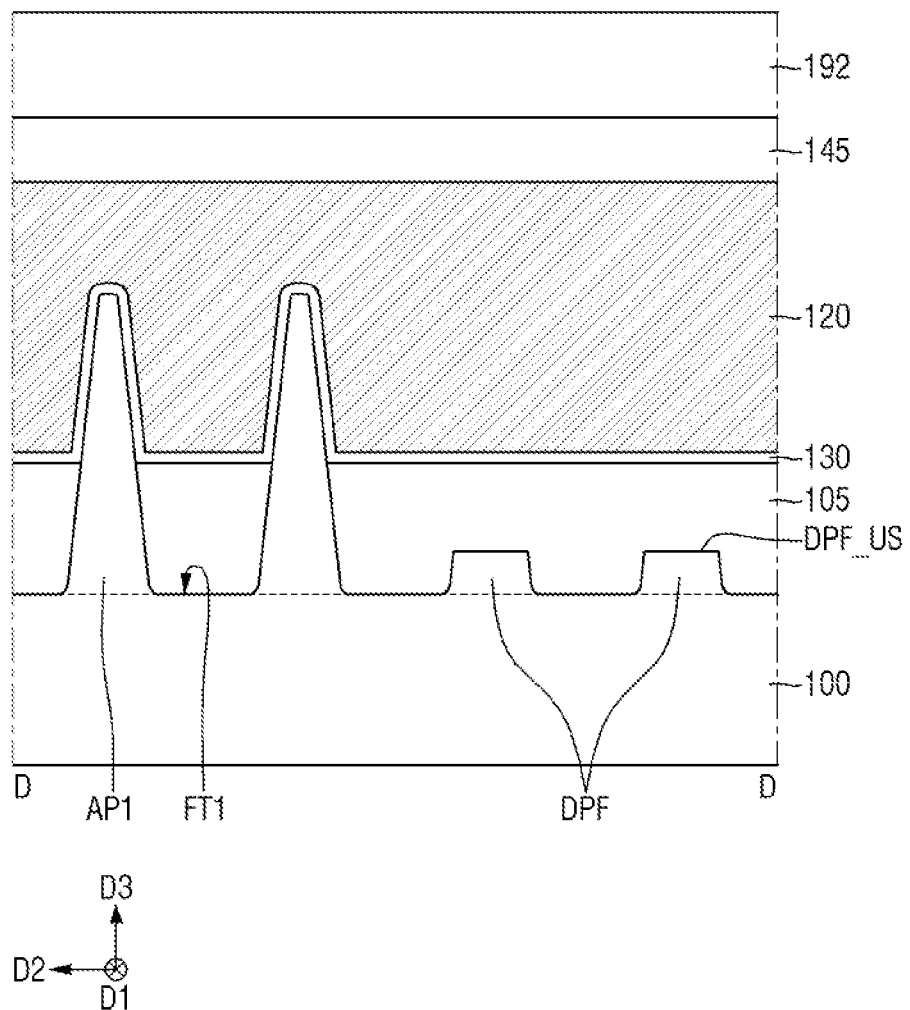

FIGS. 17 to 19 are diagrams for explaining a semiconductor device according to an embodiment of the present disclosure. For convenience of explanation, differences from those described with reference to FIGS. 1 to 7 will be mainly described.

For reference, FIG. 17 is an exemplary layout diagram for showing a semiconductor device according to an embodiment of the present disclosure. FIGS. 18 and 19 are exemplary diagrams taken along D-D of FIG. 17, respectively.

Referring to FIGS. 17 to 19, in the semiconductor device according to an embodiment of the present disclosure, the first connecting fin type pattern CF1 may be directly connected to a single first multi-channel active pattern AP1 and two second multi-channel active patterns AP2. For example, the first branch portion CF1_BP1 of the first connecting fin type pattern CF1 may be directly connected to the single first multi-channel active pattern AP1, while the second branch portion CF1_BP2 may not be connected to any of the first multi-channel active patterns AP1.

The number of first multi-channel active patterns AP1 connected to the first connecting fin type pattern CF1 is different from the number of second multi-channel active patterns AP2 connected to the first connecting fin type pattern CF1.

In FIG. 18, a deep trench DT which is deeper than the first fin trench FT1 may be formed between the first multi-channel active patterns AP1 adjacent to each other in the second direction D2. The deep trench DT may be formed in the process of removing unnecessary first multi-channel active pattern AP1.

In FIG. 19, at least one or more dummy fin type patterns DPF may be placed between the first multi-channel active patterns AP1 adjacent to each other in the second direction D2. The dummy fin type pattern DPF may extend long in the first direction D1. The field insulating film 105 covers an upper surface DPF_US of the dummy fin type pattern. The dummy fin type pattern DPF does not protrude upward from the upper surface of the field insulating film 105. In the process of removing unnecessary first multi-channel active pattern AP1, when the etch depth is not deep enough, a lower portion of the first multi-channel active pattern AP1 may not be etched and may remain as the dummy fin type pattern DPF.

Figure 22:
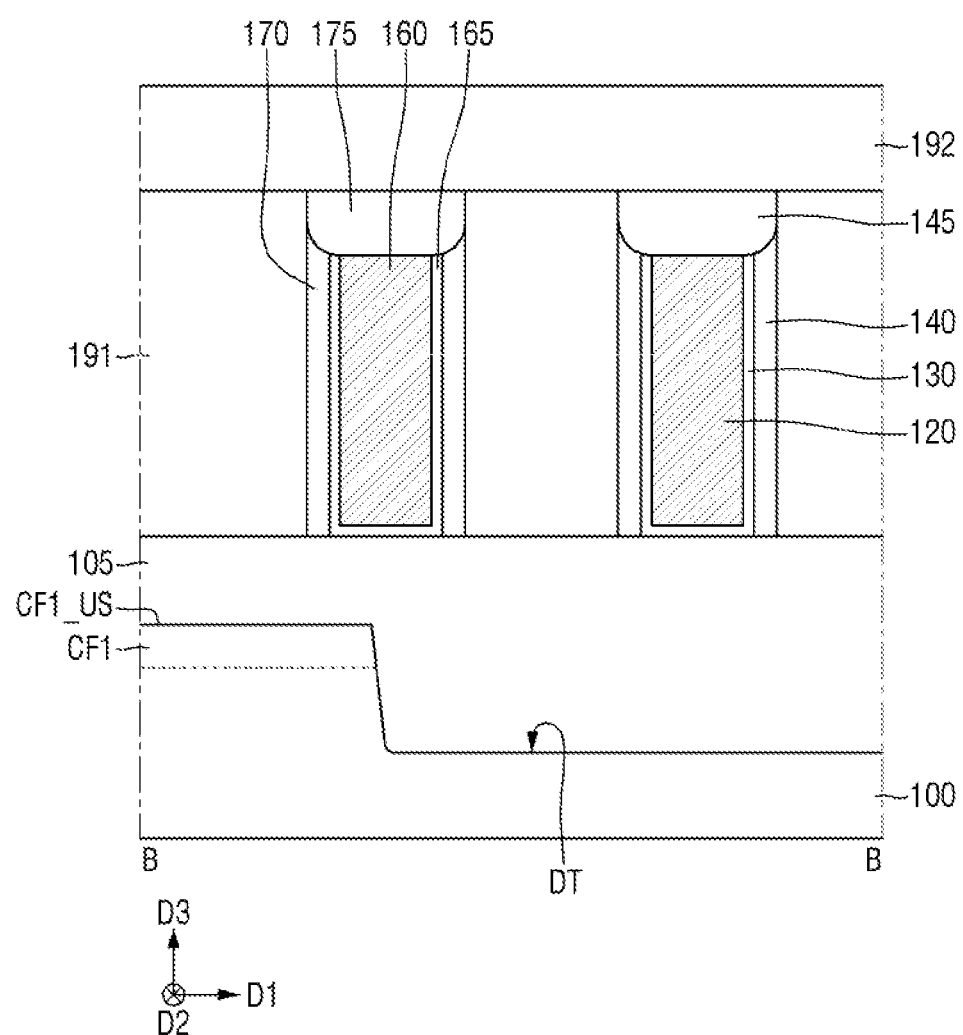
Figure 24:
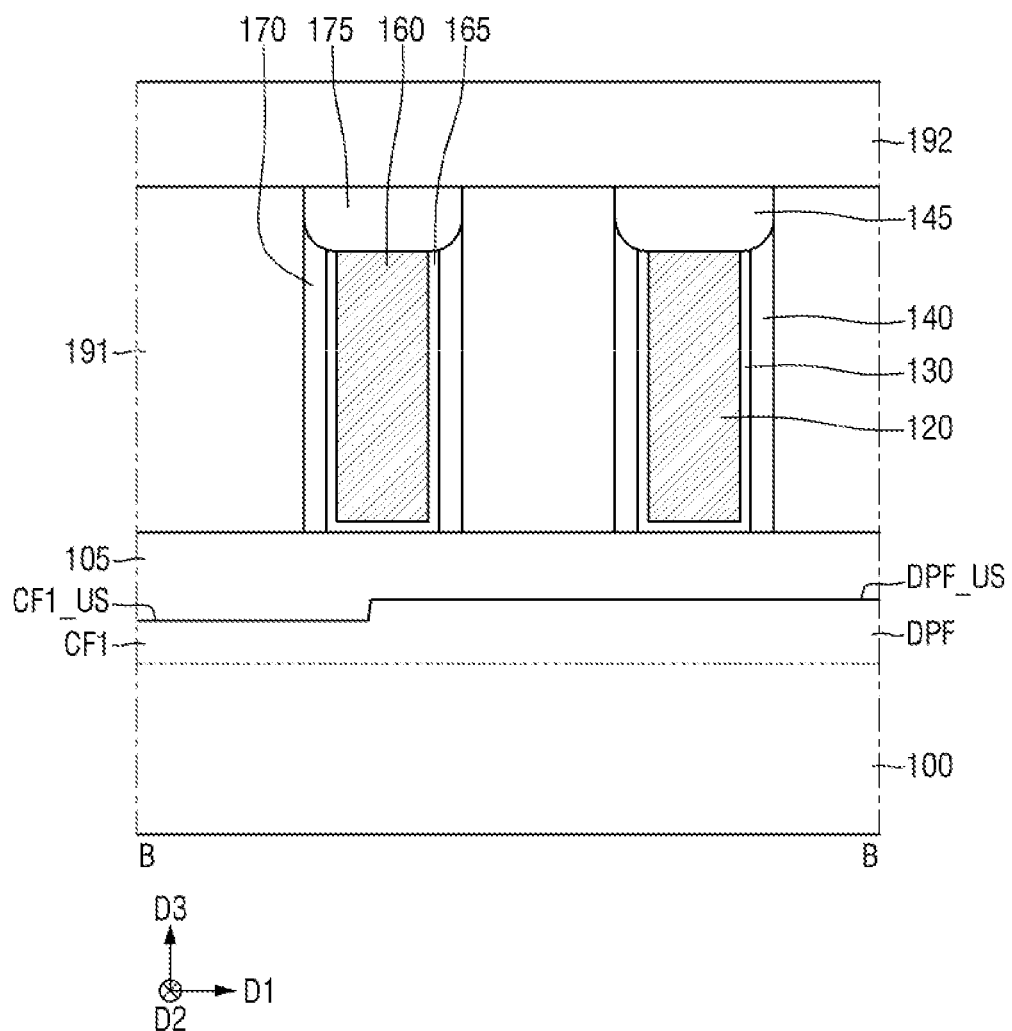

In an embodiment of the present disclosure, a cross-sectional view in which the portion of the first connecting fin type pattern CF1 not connected to the first multi-channel active pattern AP1 is cut in the first direction D1 (e.g., cut through the end portion of the second branch portion CF1_BP2) may be similar to that of FIG. 22 or FIG. 24. In FIG. 22 or FIG. 24, the portion of the first connecting fin type pattern CF1 not connected to the first multi-channel active pattern AP1 is cut in the first direction D1 through the end portion of the first branch portion CF1_BP1.

At least one or more second connecting fin type patterns CF2 may be directly connected to one of the first multi-channel active pattern AP1 and the second multi-channel active pattern AP2 not to both. At least one or more third connecting fin type patterns CF3 may be directly connected to a single first multi-channel active pattern AP1.

Unlike that shown, at least one or more third connecting fin type patterns CF3 may be directly connected to a single second multi-channel active pattern AP2.

Figure 20:
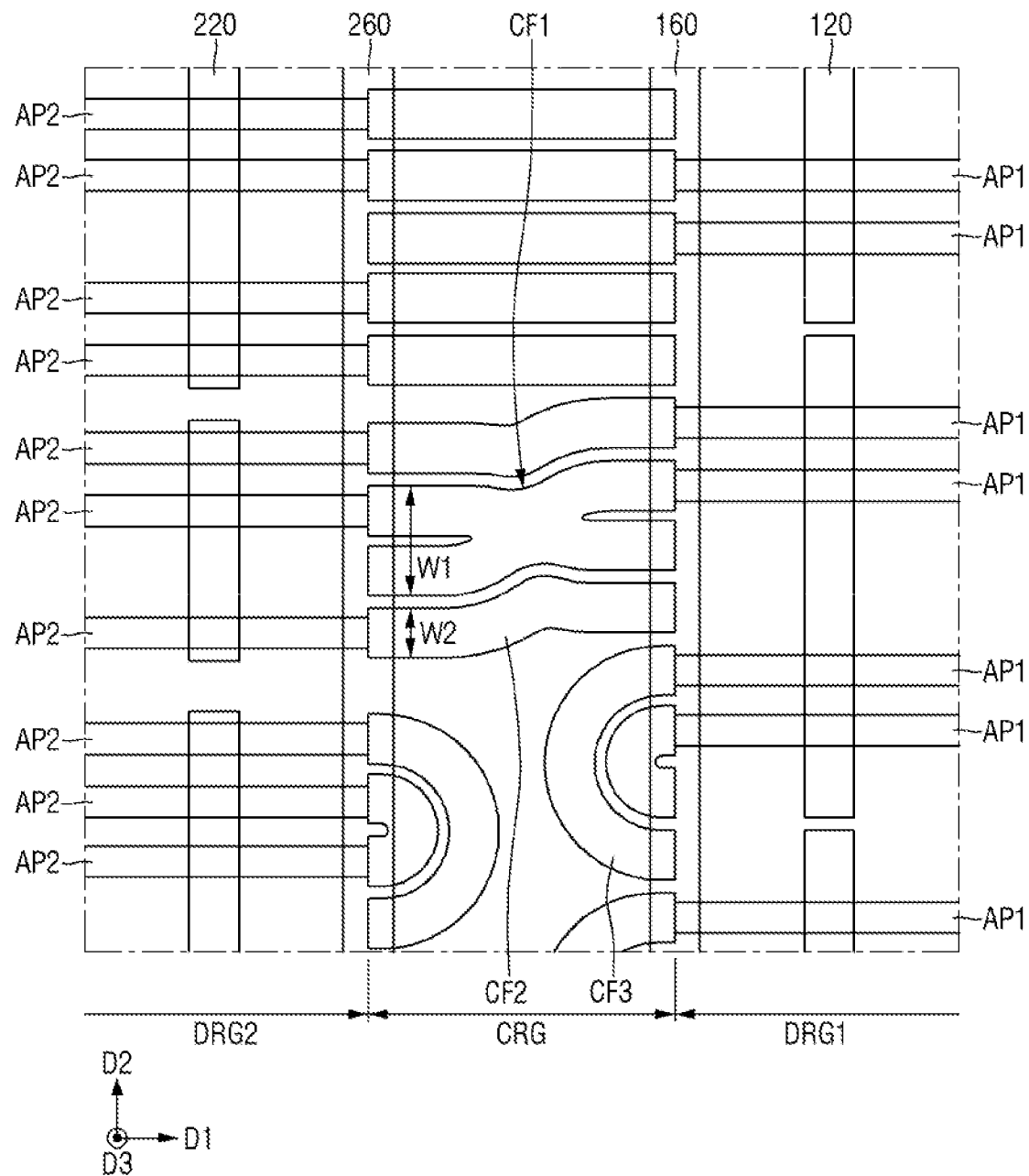
FIG. 20 is a diagram for explaining the semiconductor device according to an embodiment of the present disclosure.

FIG. 20 is a diagram for explaining a semiconductor device according to an embodiment of the present disclosure. For convenience of explanation, differences from those described with reference to FIGS. 17 to 19 will be mainly described.

Referring to FIG. 20, in the semiconductor device according to an embodiment of the present disclosure, a first connecting fin type pattern CF1 may be directly connected to a single first multi-channel active pattern AP1 and a single second multi-channel active pattern AP2. For example, the first branch portion CF1_BP1 of the first connecting fin type pattern CF1 may be directly connected to the single first multi-channel active pattern AP1, while the second branch portion CF1_BP2 may not be connected to any of the first multi-channel active patterns AP1. The third branch portion CF1_BP3 of the first connecting fin type pattern CF1 may be directly connected to the single second multi-channel active pattern AP2, while the fourth branch portion CF1_BP4 may not be connected to any of the second multi-channel active patterns AP2.

FIGS. 21 to 25 are diagrams for explaining a semiconductor device according to an embodiment of the present disclosure. For convenience of explanation, differences from those described with reference to FIGS. 1 to 7 will be mainly described.

Figure 21:
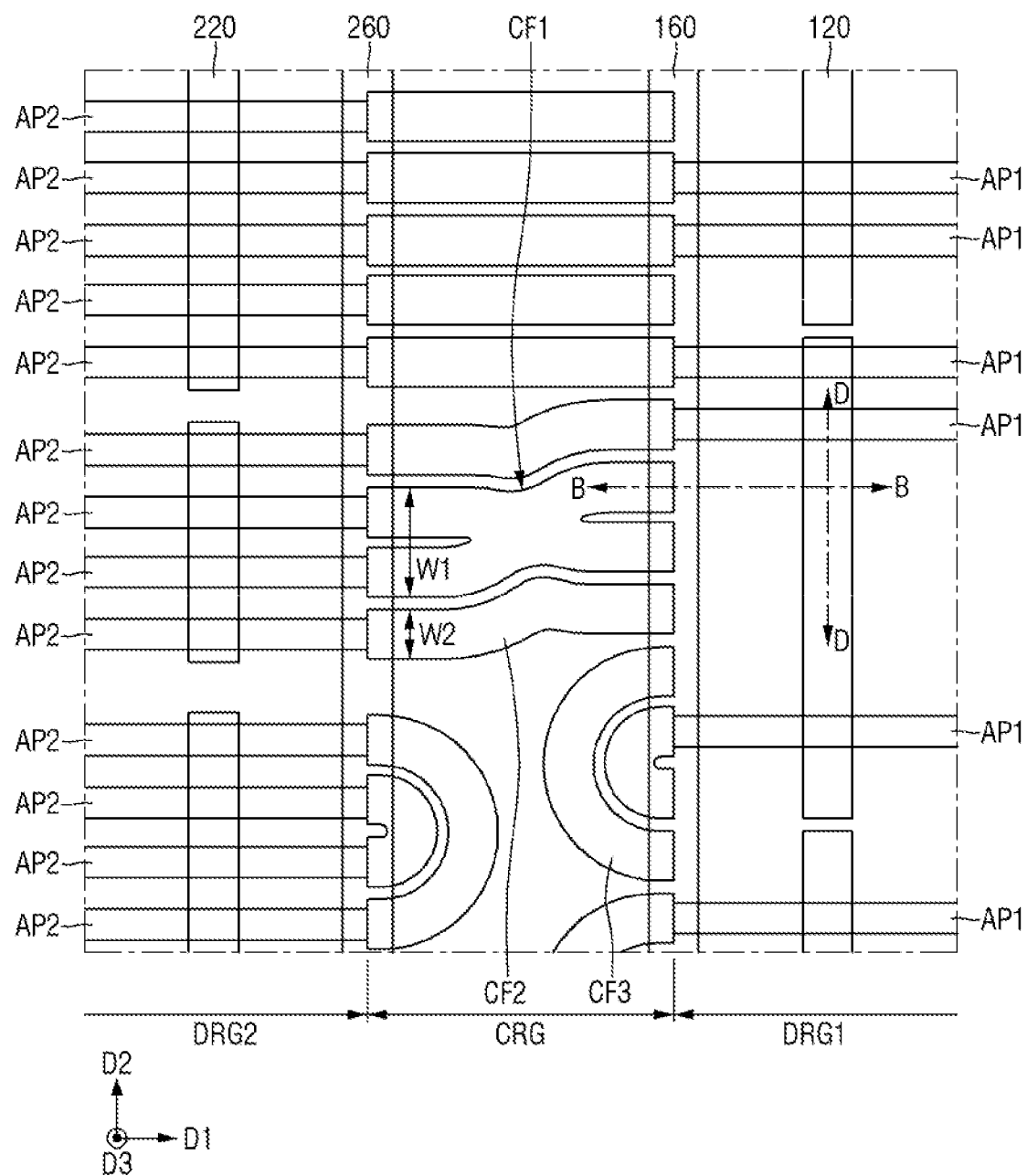
FIGS. 21 to 25 are diagrams for explaining the semiconductor device according to an embodiment of the present disclosure.
Figure 23:
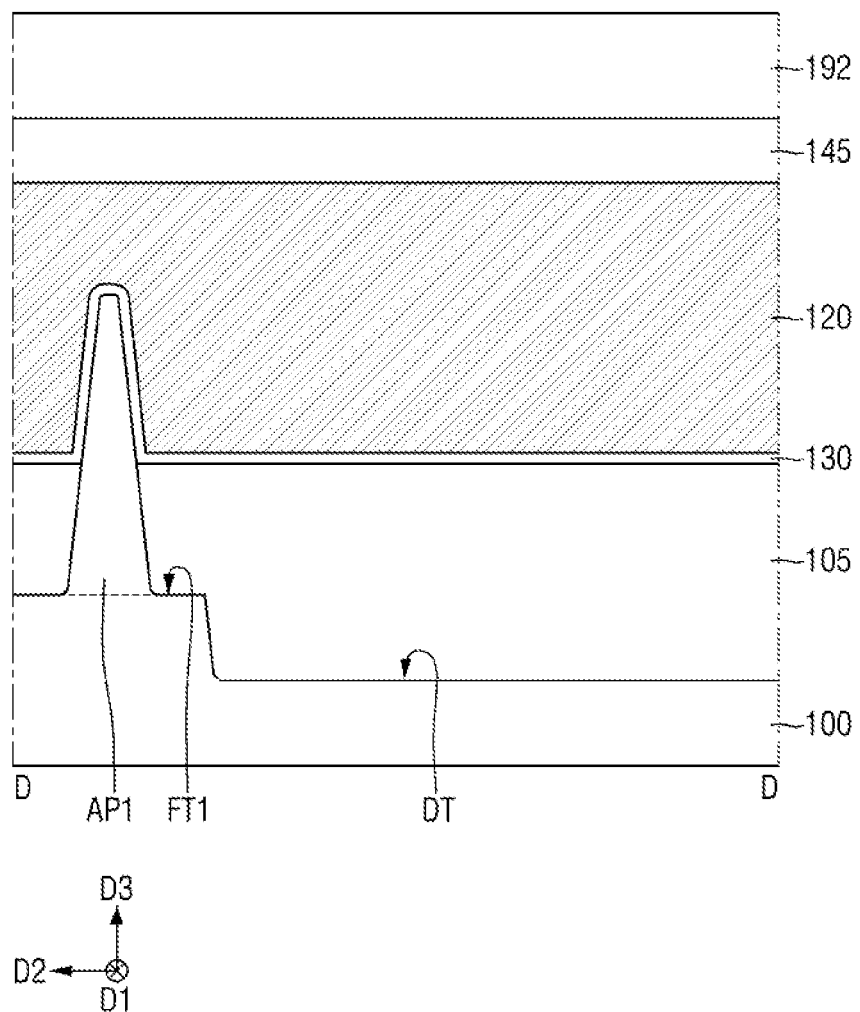
Figure 25:
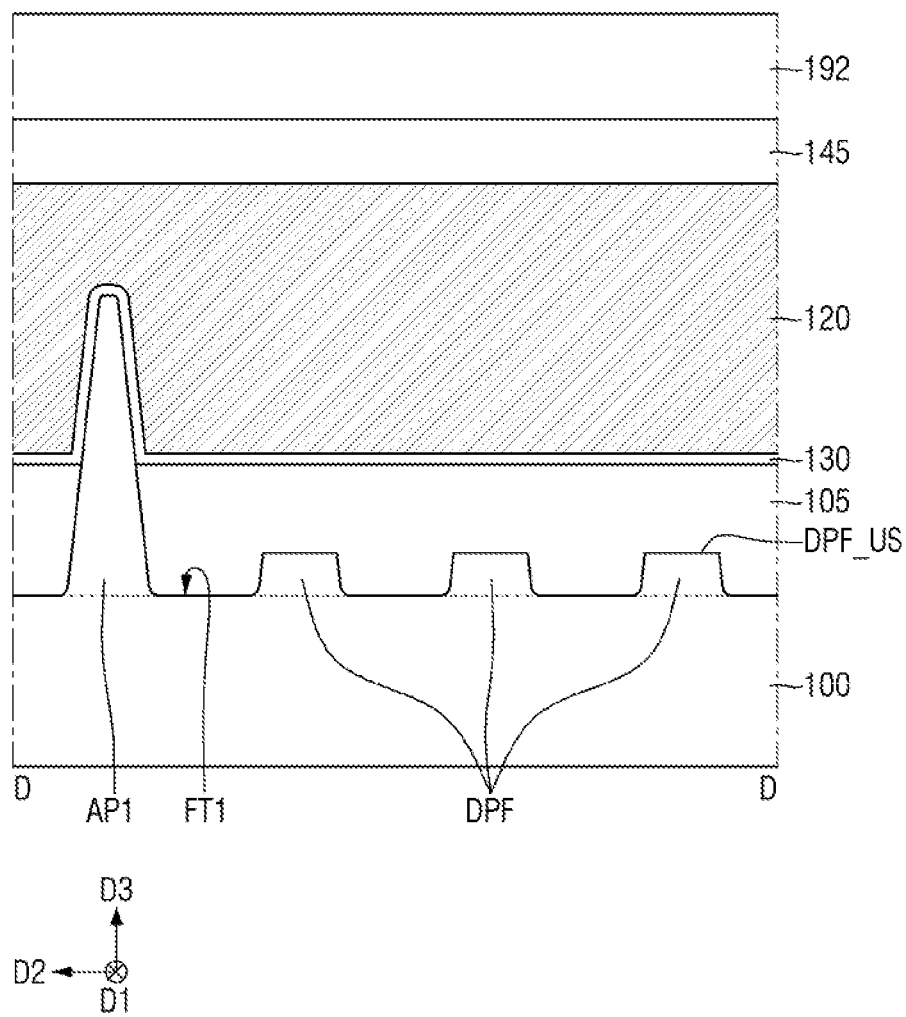

For reference, FIG. 21 is an exemplary layout diagram for showing a semiconductor device according to an embodiment of the present disclosure. FIGS. 22 and 24 are exemplary diagrams taken along B-B of FIG. 21, respectively. FIGS. 23 and 25 are exemplary diagrams taken along D-D of FIG. 21, respectively.

Referring to FIGS. 21 to 25, in the semiconductor device according to an embodiment of the present disclosure, the first connecting fin type pattern CF1 is directly connected to two of the second multi-channel active patterns AP2, but may not be directly connected to the first multi-channel active pattern AP1. For example, the first branch portion CF1_BP1 and the second branch portion CF1_BP2 of the first connecting fin type pattern CF1 may not be connected to any of the first multi-channel active patterns AP1. The third branch portion CF1_BP3 and the fourth branch portion CF1_BP4 of the first connecting fin type pattern CF1 may each be directly connected to one of the second multi-channel active patterns AP2, respectively.

In FIGS. 22 and 23, a deep trench DT which is deeper than the first fin trench FT1 may be formed at the boundary between the first element region DRG1 and the connecting region CRG.

In FIGS. 24 and 25, at a boundary between the first element region DRG1 and the connecting region CRG, the first connecting fin type pattern CF1 and the dummy fin type pattern DPF may form a boundary. Although a height of the upper surface CF1_US of the first connecting fin type pattern is shown as being different from a height of the upper surface DPF_US of the dummy fin type pattern, the present disclosure is not limited thereto. For example, in a fabricating process according to an embodiment of the present disclosure, when the fin cut process and the process of removing unnecessary first multi-channel active patterns AP1 are carried out at the same time with the same process, a height of the upper surface CF1_US of the first connecting fin type pattern may be the same as a height of the upper surface DPF_US of the dummy fin type pattern. The fin cut process may be a process used to cut the pre-active patterns to smaller segments and/or to cut loop ends of the pre-active patterns.

Unlike that shown, in an embodiment of the present disclosure, the first connecting fin type pattern CF1 may be directly connected to a single second multi-channel active pattern AP2. In an embodiment of the present disclosure, the first connecting fin type pattern CF1 may not be directly connected to the second multi-channel active pattern AP2.

Unlike that shown, at least one or more second connecting fin type patterns CF2 may not be directly connected to the first multi-channel active pattern AP1 and the second multi-channel active pattern AP2. Also, at least one or more third connecting fin type patterns CF3 may not be directly connected to the first multi-channel active pattern AP1. At least one or more third connecting fin type patterns CF3 may not be directly connected to the second multi-channel active pattern AP2.

FIGS. 26 to 31 are diagrams for explaining a method for fabricating a mask according to an embodiment of the present disclosure.

Figure 26:
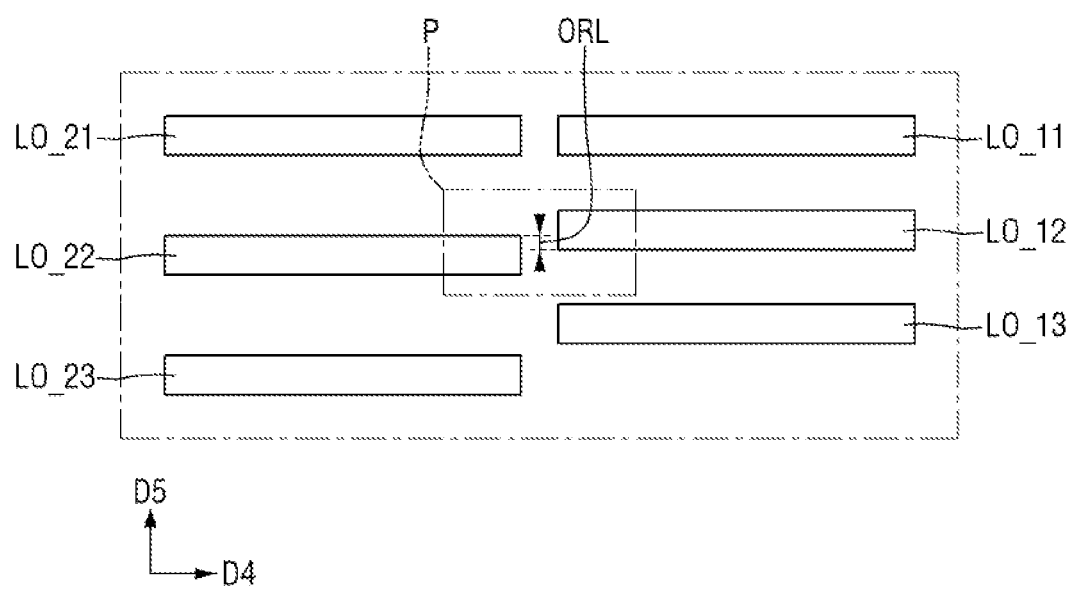
FIGS. 26 to 31 are diagrams for explaining a method for fabricating a mask according to an embodiment of the present disclosure.

Referring to FIG. 26, a mask target layout is determined. The mask target layout may include a first layout group and a second layout group.

The first layout group may include first to third layout patterns LO_11, LO_12, and LO_13 that extend long in a fourth direction D4. The first to third layout patterns LO_11, LO_12, and LO_13 may be spaced apart from each other in a fifth direction D5 perpendicular to the fourth direction D4.

The second layout group may include fourth to sixth layout patterns LO_21, LO_22, and LO_23 that extend long in the fourth direction D4. The fourth to sixth layout patterns LO_21, LO_22, and LO_23 may be spaced apart from each other in the fifth direction D5.

Next, an overlap run length ORL may be extracted between the first to third layout patterns LO_11, LO_12, and LO_13 and the fourth to sixth layout patterns LO_21, LO_22, and LO_23. The overlap run length ORL may indicate a degree of overlap in the fourth direction D4 between a layout pattern of the first layout group and a layout pattern of the second layout group. For example, FIG. 26 shows the overlap run length ORL between the second layout pattern LO_12 and the fifth layout pattern LO_22.

A degree of merge between the layout pattern of the first layout group and the layout pattern of the second layout group facing each other in the fourth direction D4 is determined, using the overlap run length ORL.

If the overlap run length ORL is a % or less, the layout pattern of the first layout group and the layout pattern of the second layout group are classified into an unmerge group. If the overlap run length ORL exceeds a % and is b % or less, the layout pattern of the first layout group and the layout pattern of the second layout group are classified into a soft merge group. If the overlap run length ORL exceeds b % and is 100% or less, the layout pattern of the first layout group and the layout pattern of the second layout group are classified into a hard merge group. Here, "a" and "b" are natural numbers smaller than 100, and "a" is smaller than "b". The values of "a" and "b" may be defined by the actually printed images or the images obtained through simulation with a set of provided layout patterns. The values of "a" and "b" may vary depending on the resolution capability of the exposure tool used in printing the images, and the size and proximity of the layout patterns of the mask used in printing the images.

The second layout pattern LO_12 and the fifth layout pattern LO_22 are classified into the soft merge group. The first layout pattern LO_11 and the fourth layout pattern LO_21 are classified into the hard merge group. The third layout pattern LO_13 and the sixth layout pattern LO_23 are classified into the unmerge group.

A method for fabricating a mask layout for implementing the second layout pattern LO_12 and the fifth layout pattern LO_22 will be described below. Further, FIGS. 27 to 30 are portions corresponding to portion P of FIG. 26.

Figure 27:
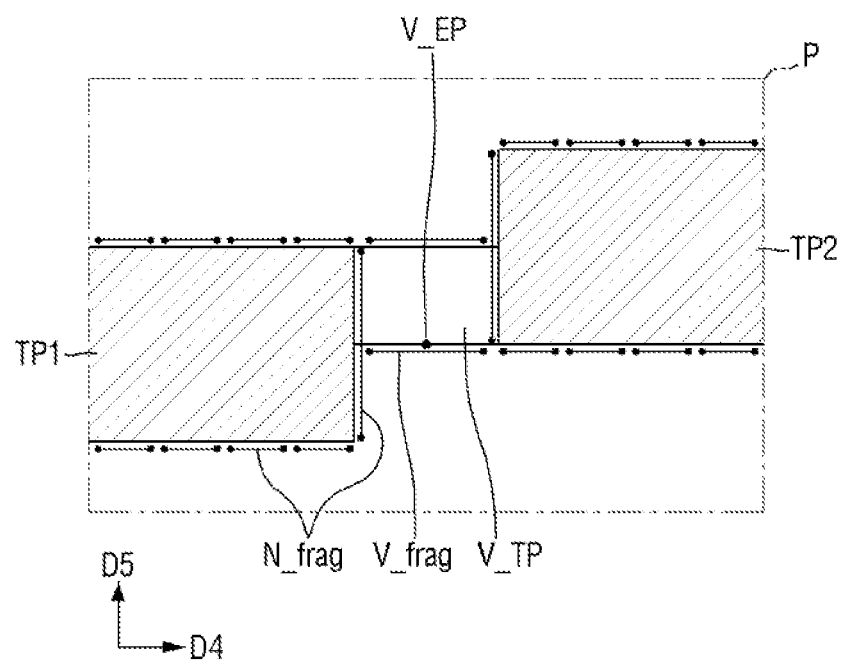

Referring to FIG. 27, a virtual target pattern V_TP is generated between the first target pattern TP1 and the second target pattern TP2 that overlap in the fourth direction D4, which is the length direction. The first target pattern TP1 corresponds to the fifth layout pattern LO_22 of FIG. 26, and the second target pattern TP2 corresponds to the second layout pattern LO_12 of FIG. 26.

The fragment is generated in the first target pattern TP1, the second target pattern TP2, and the virtual target pattern V_TP. The fragment includes a normal fragment N_frag and a virtual fragment V_frag. The normal fragment N_frag is generated in the first target pattern TP1 and the second target pattern TP2. The virtual fragment V_frag is generated in the virtual target pattern V_TP.

A virtual evaluation point V_EP is generated in the virtual target pattern V_TP.

Figure 28:
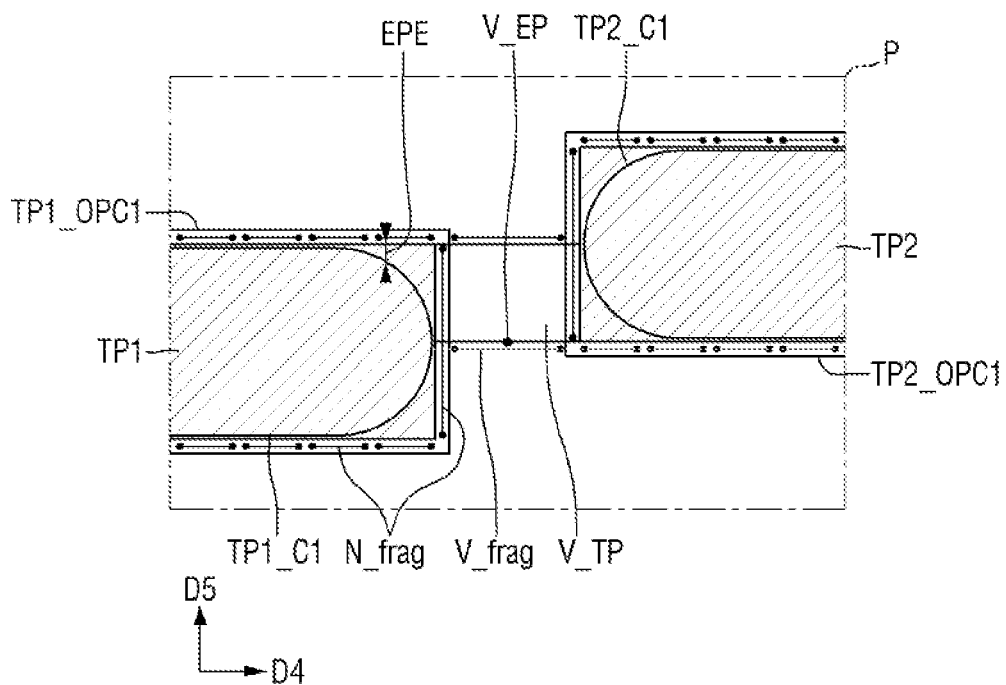

Referring to FIG. 28, first contours TP1_C1 and TP2_C1 of the first target pattern TP1 and the second target pattern TP2 are extracted through simulation, by inputting the first mask data into an optical proximity correction (OPC) model. The first mask data includes the fragment.

Various basic data may be input into the OPC model, as input data. Here, the basic data may include mask data of the fragment. Further, the basic data may include the degree data such as a thickness, a refractive index, and a dielectric constant of photoresist (PR), and may include data of a source map on an illumination system. However, the basic data is not limited to the data exemplified above. On the other hand, the mask data may include not only data of fragment, but also data such as the form of patterns, the position of patterns, the kind of measurement (measurement of space or line) of the patterns, and a basic measurement value.

A contour of the target pattern is an output obtained through the simulation using the OPC model, and may correspond to the form of the pattern formed on the wafer through a photolithography process using the photo mask. For example, the shapes of a first contour TP1_C1 of the first target pattern TP1 and a first contour TP2_C1 of the second target pattern TP2 may be transferred onto the wafer.

A first OPC pattern TP1_OPC1 of the first target pattern and a first OPC pattern TP2_OPC1 of the second target pattern may be OPC patterns used to extract the first contour TP1_C1 of the first target pattern TP1 and the first contour TP2_C1 of the second target pattern TP2. That is, when the photomask is produced on the basis of the mask layout acquired through the first OPC pattern TP1_OPC1 of the first target pattern and the first OPC pattern TP2_OPC1 of the second target pattern, the shapes of the first contour TP1_C1 of the first target pattern TP1 and the first contour TP2_C1 of the second target pattern TP2 may be transferred onto the wafer.

Next, an edge placement error (EPE) is calculated. The EPE may be a difference between the contour and the target pattern. A first normal EPE between the first target pattern TP1, the second target pattern TP2 and the first contours TP1_C1 and TP2_C1 may be calculated. Also, a first virtual EPE (V_EPE) between the virtual target pattern V_TP and the first contours TP1_C1 and TP2_C1 may be calculated. The first virtual EPE may be calculated at the virtual evaluation point V_EP.

A displacement of the fragment is determined, using the first virtual EPE. The displacement may be calculated by multiplying the first virtual EPE by feedback. The feedback may be set by a user who performs the OPC model. For example, although feedback may be, but is not limited to, greater than −1 and smaller than 0. Further, the sign of the displacement, that is, (−) and (+) may mean directions of movement of the fragment.

Figure 29:
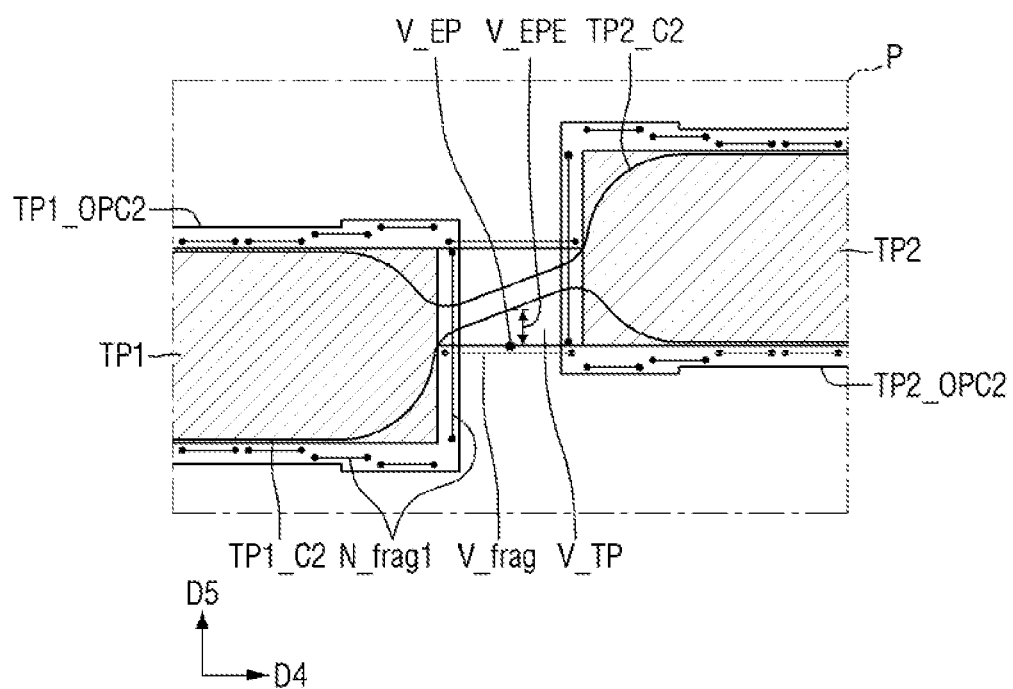

Referring to FIGS. 28 and 29, a first movement normal fragment N_frag1 is located by being moved from the normal fragment N_frag by the displacement determined using the first virtual EPE. Second mask data may then be obtained.

Second contours TP1_C2 and TP2_C2 of the first target pattern TP1 and the second target pattern TP2 are extracted through the simulation, by inputting the second mask data into the OPC model.

The first movement normal fragment N_frag1 may be included in the second mask data.

The second contour TP1_C2 of the first target pattern TP1 and the second contour TP2_C2 of the second target pattern TP2 may be connected in the virtual target pattern V_TP region.

A second OPC pattern TP1_OPC2 of the first target pattern and a second OPC pattern TP2_OPC2 of the second target pattern may be the OPC pattern used to extract the second contour TP1_C2 of the first target pattern TP1 and the second contour TP2_C2 of the second target pattern TP2.

Subsequently, a second virtual EPE between the virtual target pattern V_TP and the second contours TP1_C2 and TP2_C2 may be calculated at the virtual evaluation point V_EP.

The aforementioned process is repeated, until the virtual EPE is equal to or less than a set reference value or the number of times of simulations performed by the OPC model described above falls within a set reference number. For example, the second virtual EPE is made to converge to 0 nm through repetition of the aforementioned process. If the second virtual EPE satisfies the above-mentioned conditions, the second mask data may be determined as a final mask data.

If the second virtual EPE does not satisfy the above-mentioned conditions, a displacement of the fragment is determined, using the second virtual EPE. For example, the displacement may be calculated by multiplying the second virtual EPE by feedback. The feedback may be set by a user who performs the OPC model.

Figure 30:
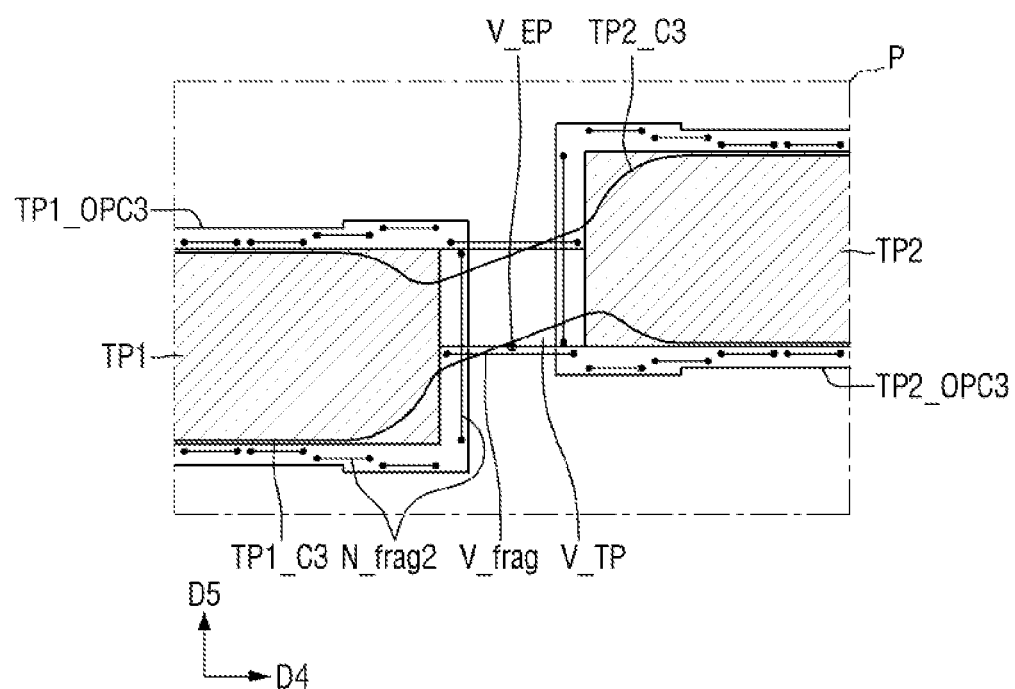

Referring to FIGS. 29 and 30, a second movement normal fragment N_frag2 is located by being moved from the first movement normal fragment N_frag1 by the displacement determined using the second virtual EPE. Third mask data may then be obtained.

Third contours TP1_C3 and TP2_C3 of the first target pattern TP1 and the second target pattern TP2 are extracted through the simulation, by inputting the third mask data into the OPC model.

The second movement normal fragment N_frag2 may be included in the third mask data.

The third contour TP1_C3 of the first target pattern TP1 and the third contour TP2_C3 of the second target pattern TP2 may be connected in the virtual target pattern V_TP region. Further, a third virtual EPE between the virtual target pattern V_TP and the third contours TP1_C3 and TP2_C3 may be smaller than the set reference value at the virtual evaluation point V_EP.

A third OPC pattern TP1_OPC3 of the first target pattern and a third OPC pattern TP2_OPC3 of the second target pattern may be the OPC pattern used to extract the third contour TP1_C3 of the first target pattern TP1 and the third contour TP2_C3 of the second target pattern TP2.

The third OPC pattern TP1_OPC3 of the first target pattern and the third OPC pattern TP2_OPC3 of the second target pattern may be determined as the final mask data.

In general, the EPE acquired in the contour extraction of the target pattern through the first OPC simulation and the consequent EPE calculation may deviate significantly from the reference value. Therefore, it may be determined that the OPC simulation is not performed after the OPC simulation is performed several times to several tens of times. As a result, mask data including fragment data that has moved through the execution process of the multiple times of OPC simulations may become the final mask data.

In an embodiment of the present disclosure, in the process of determining the final mask data, a reference value of EPE (or V_EPE) and a reference number of simulations performed by the OPC model described above may both be set, and the OPC simulation may be repeatedly performed until the set reference value of EPE (or V_EPE) or the set reference number of simulations performed by the OPC model described above whichever is reached earlier to obtain mask data as the final mask data.

Figure 31:
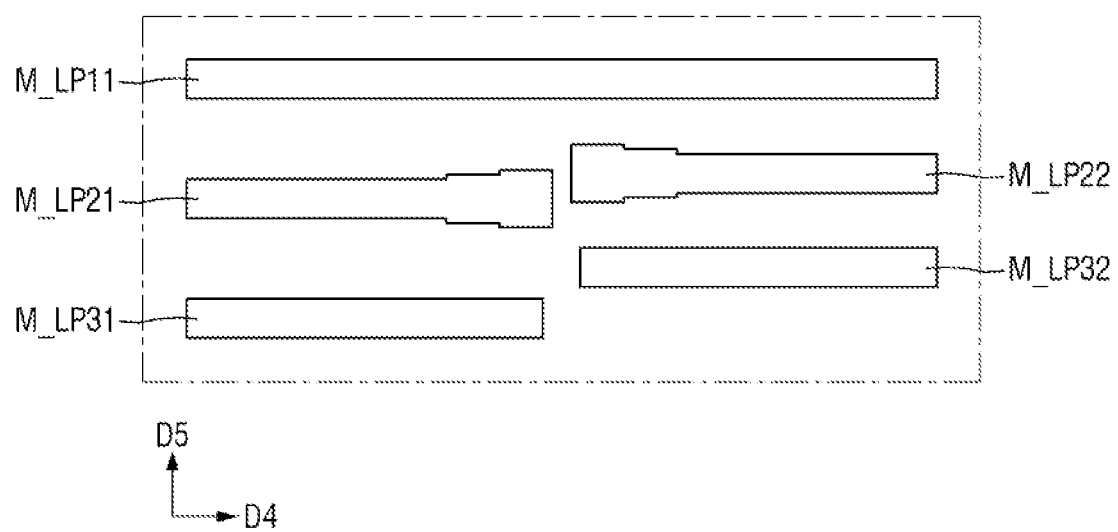

Referring to FIGS. 26 and 31, a photomask may be fabricated using the final mask data.

The photomask may include first to fifth photomask patterns M_LP11, M_LP21, M_LP22, M_LP31, and M_LP32.

The first photomask pattern M_LP11 may be manufactured on the basis of a mask layout for implementing the fourth layout pattern LO_21 and the first layout pattern LO_11 classified into the hard merge group. The first photomask pattern M_LP11 may be acquired through the OPC pattern of the simulation of the OPC model.

The second and third photomask patterns M_LP21 and M_LP22 may be manufactured on the basis of a mask layout for implementing the fifth layout pattern LO_22 and the second layout pattern LO_12 classified into the soft merge group. The second and third photomask patterns M_LP21 and M_LP22 may be acquired through the OPC pattern of the simulation of the OPC model described through FIGS. 27 to 30.

The fourth and fifth photomask patterns M_LP31 and M_LP32 may be manufactured on the basis of a mask layout for implementing the sixth layout pattern LO_23 and the third layout pattern LO_13 classified into the unmerge group. The fourth and fifth photomask patterns M_LP31 and M_LP32 may be acquired through the OPC pattern of the simulation of the OPC model.

After performing the simulation of the OPC model described with reference to FIGS. 26 to 30, mask tape-out (MTO) design data is transmitted. In general, the MTO may mean a process of delivering the final mask data after completion of the OPC step to a mask manufacturing team to request the mask manufacturing. Therefore, the MTO design data may ultimately correspond to the final mask data on which the OPC simulation is performed. Such MTO design data may have a graphic data format used in electronic design automation (EDA) software and the like. For example, the MTO design data may have a data format such as Graphic Data System II (GDSII) or Open Artwork System Interchange Standard (OASIS), and may describe the desired mask pattern of a mask to be manufactured.

After delivery of the MTO design data, a mask data preparation (MDP) is performed. The MDP may include, for example, format conversion called fracturing, barcode for mechanical reading, standard mask pattern for inspection, augmentation of job deck, etc., and verification of automatic and manual ways. Here, the job deck may mean creation of a text file related to a set of commands such as placement information of multi-mask files, standard dose, photolithography speed and exposure method.

The format conversion, that is, fracturing, may mean a process of dividing the MTO design data into each region and changing the format to a format for an electron beam photolithography machine. The fracturing may include, for example, data manipulations such as scaling, data sizing, data rotation, pattern reflection, and color inversion. In the conversion process through fracturing, the data on a lot of systematic errors that may occur somewhere in the process of transmitting from the design data to the image on the wafer may be corrected. The data correction process of the systematic error is called a mask process correction (MPC), and may include, for example, a line width adjustment called a CD adjustment, a work of enhancing the pattern arrangement accuracy, and the like. Therefore, the fracturing may contribute to the enhancement of the quality of the final mask, and may be a process performed in advance for correcting the mask process. Here, the systematic errors may be induced by distortion that occurs in the photolithography process, the mask development and etching process, the wafer imaging process, and the like.

The mask data preparation may include MPC. As described above, the MPC refers to a process of correcting an error that occurs during the photolithography process, that is, a system error. Here, the photolithography process may be a concept that generally includes electron beam writing, development, etching, baking, and the like. For example, the MPC may be applied to the MTO design data to adjust one or more of the size, shape, location, edge location of the pattern elements of the mask and/or corresponding electron beam dosage (or beam energy intensity) used in writing the mask. In addition, the data processing may be performed before the photolithography process. The data processing is a kind of preprocessing process of mask data, and may include a grammar check of the mask data, a photolithography time prediction, and the like.

After the mask data preparation, the mask substrate is exposed on the basis of the mask data. Here, the photolithography may mean, for example, electron beam writing. Here, the electron beam writing may be performed, for example, in a gray writing way using a multi-beam mask writer (MBMW). Further, the electron beam writing may be performed, using a variable shape beam (VSB) photolithography machine.

After the mask data preparation step and before the photolithography process, a process of converting the mask data into pixel data may be performed. The pixel data is data that is directly used for actual photolithography, and may include data on the shape as a target of photolithography and data on dose assigned to each of them. Here, data on the shape may be bit-map data in which the shape data, which is vector data, is converted through rasterization or the like. After the pixel data is generated, the electron beam writing process may be performed by irradiating an electron beam or multiple electron beams on a mask substrate based on the pixel data.

After the photolithography process, a series of processes are performed to complete the photomask. The series of processes may include, for example, processes such as development, etching, and cleaning. In addition, a series of processes for fabricating a photomask may include a measurement process, a defect inspection, and a defect repair process. Further, a pellicle coating process may be included. Here, the pellicle coating process may mean a process of attaching pellicle to the photomask surface to protect the mask from subsequent contamination during delivery of the photomask and available life time of the mask, when it is checked that there are no contaminated particles or chemical stains through final cleaning and inspection.

FIGS. 32A to 34B are intermediate stage diagrams for explaining a method for fabricating the semiconductor device according to an embodiment of the present disclosure.

Figure 32A:
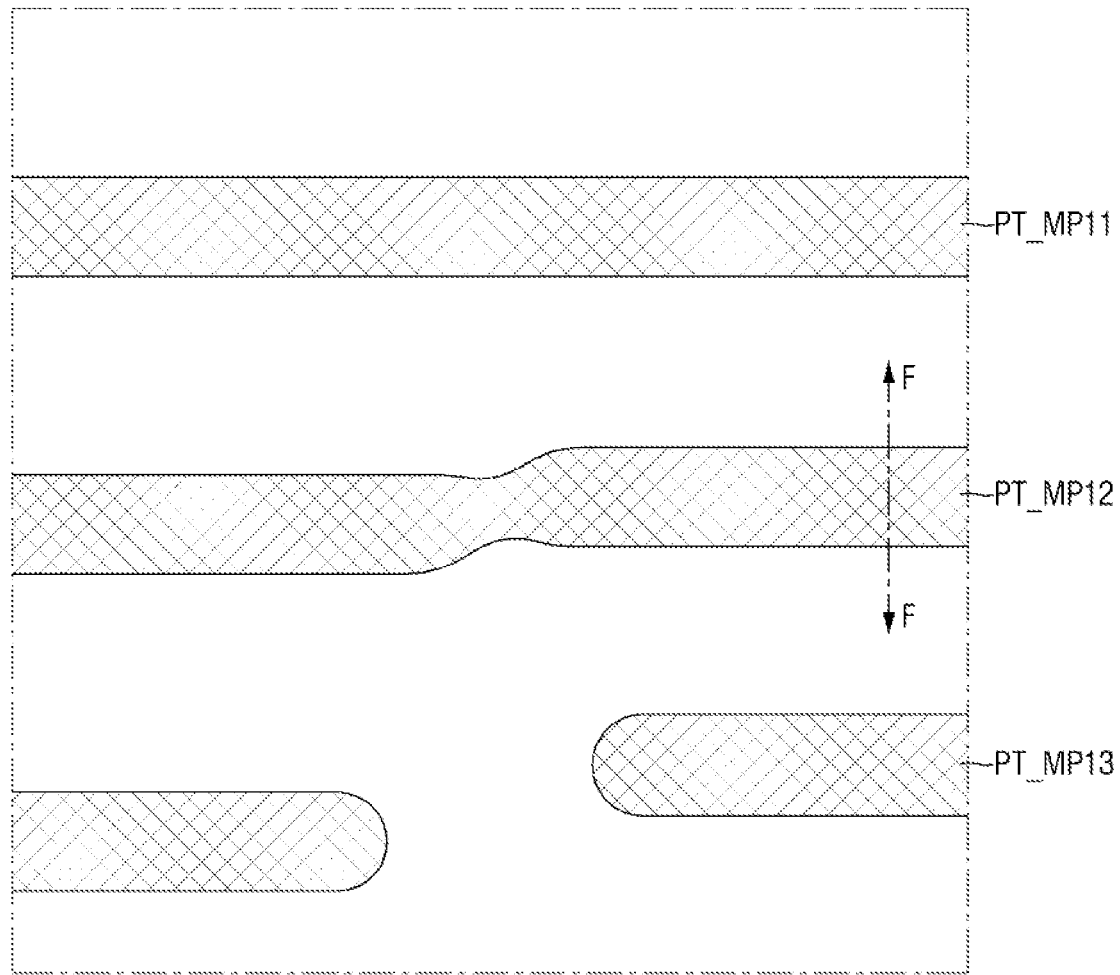
FIGS. 32A, 32B, 33A, 33B, 34A and 34B are intermediate stage diagrams for explaining a method for fabricating a semiconductor device according to an embodiment of the present disclosure.
Figure 32B:
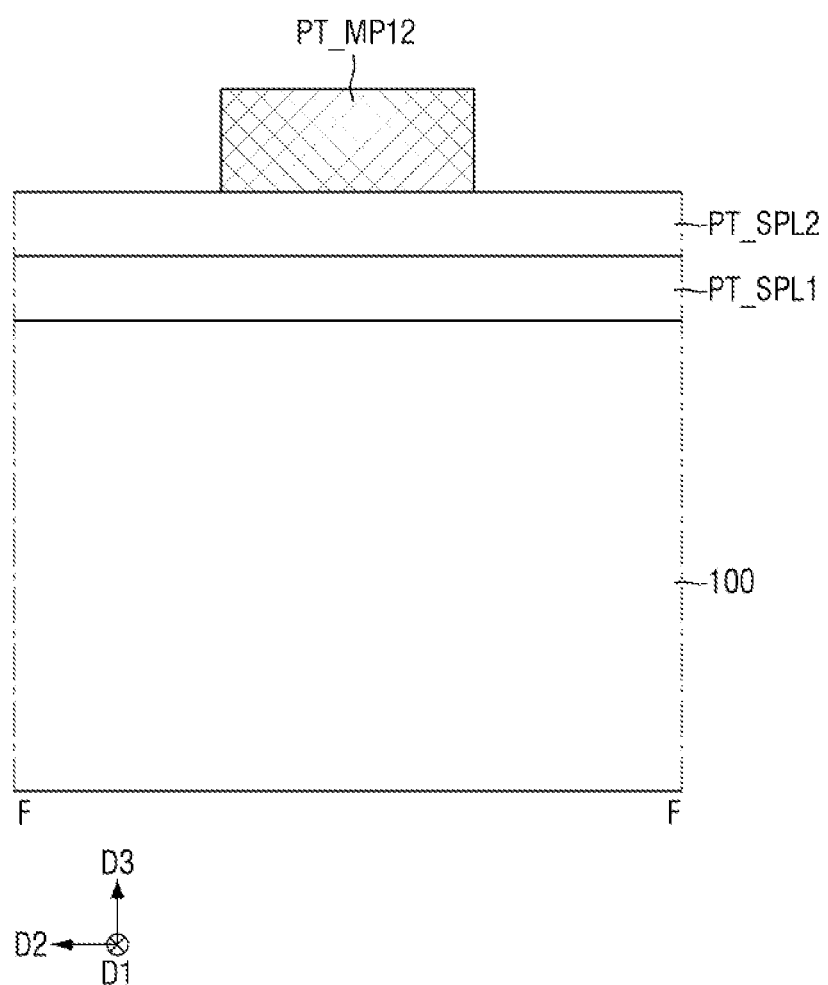
Figure 33A:
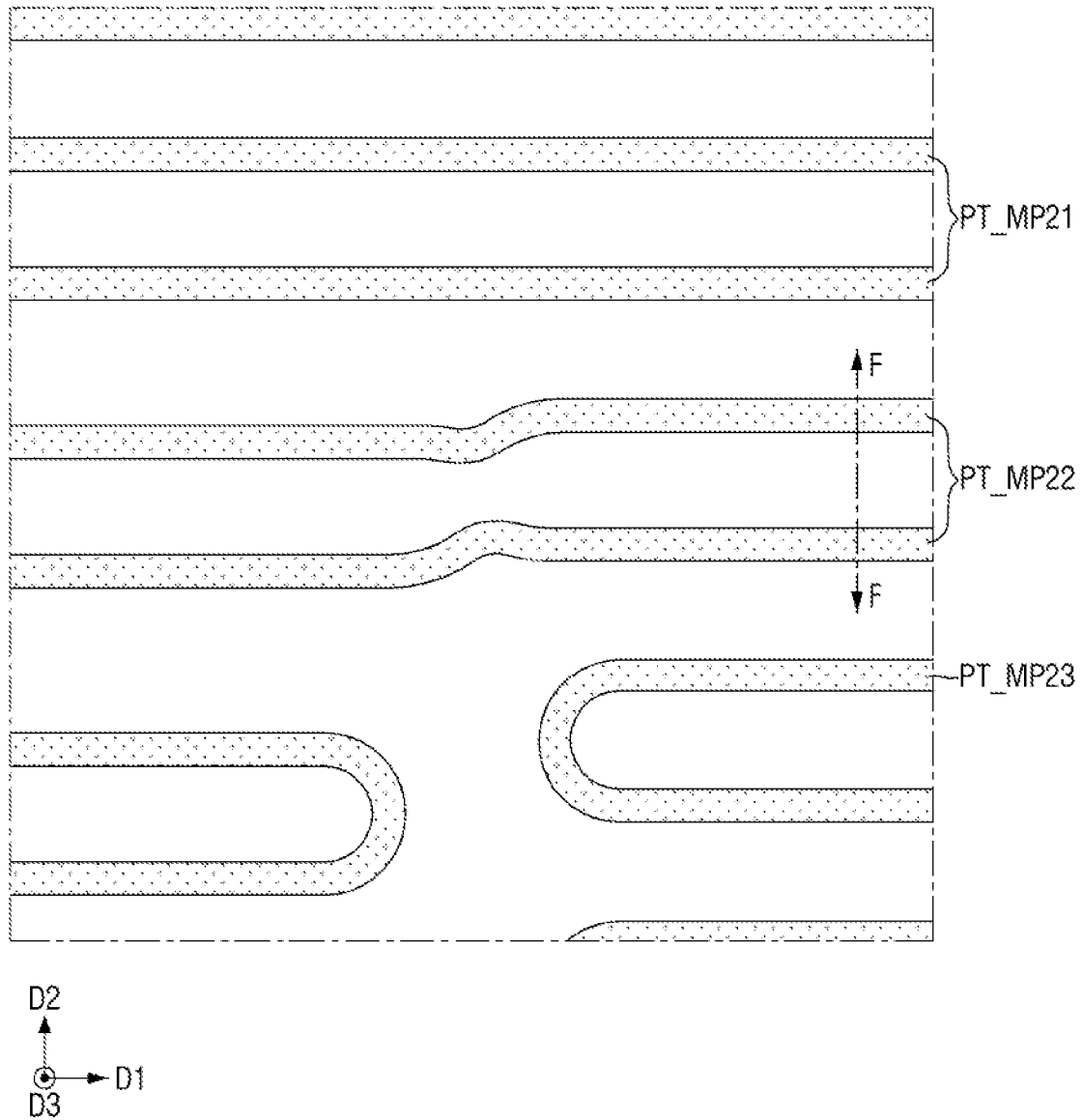
Figure 33B:
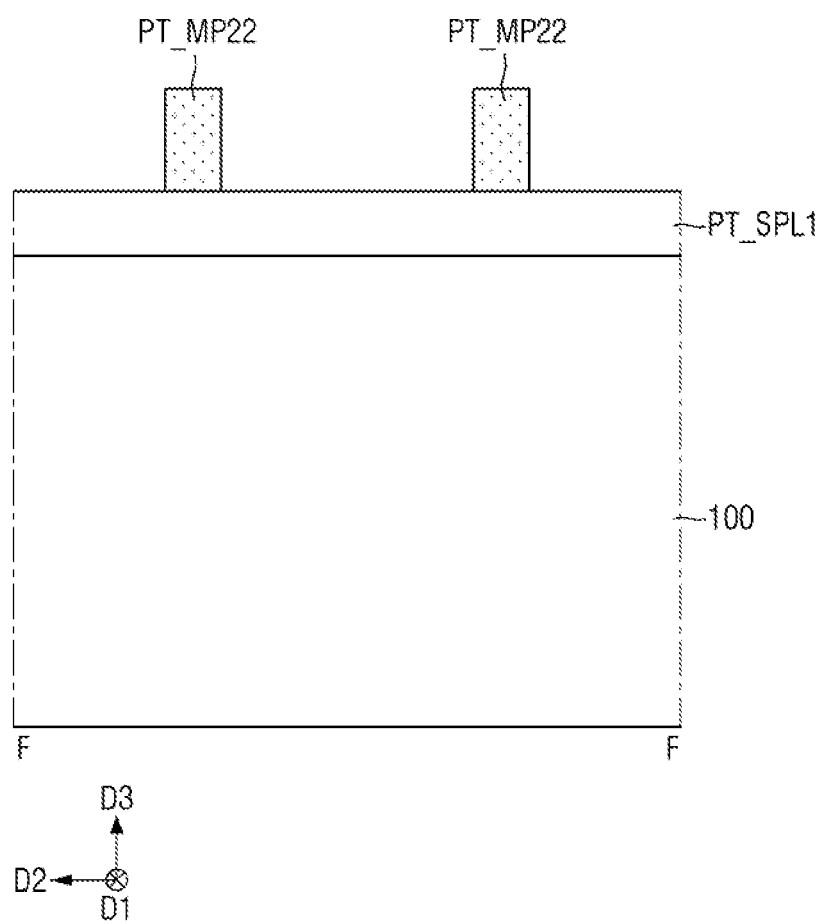
Figure 34A:
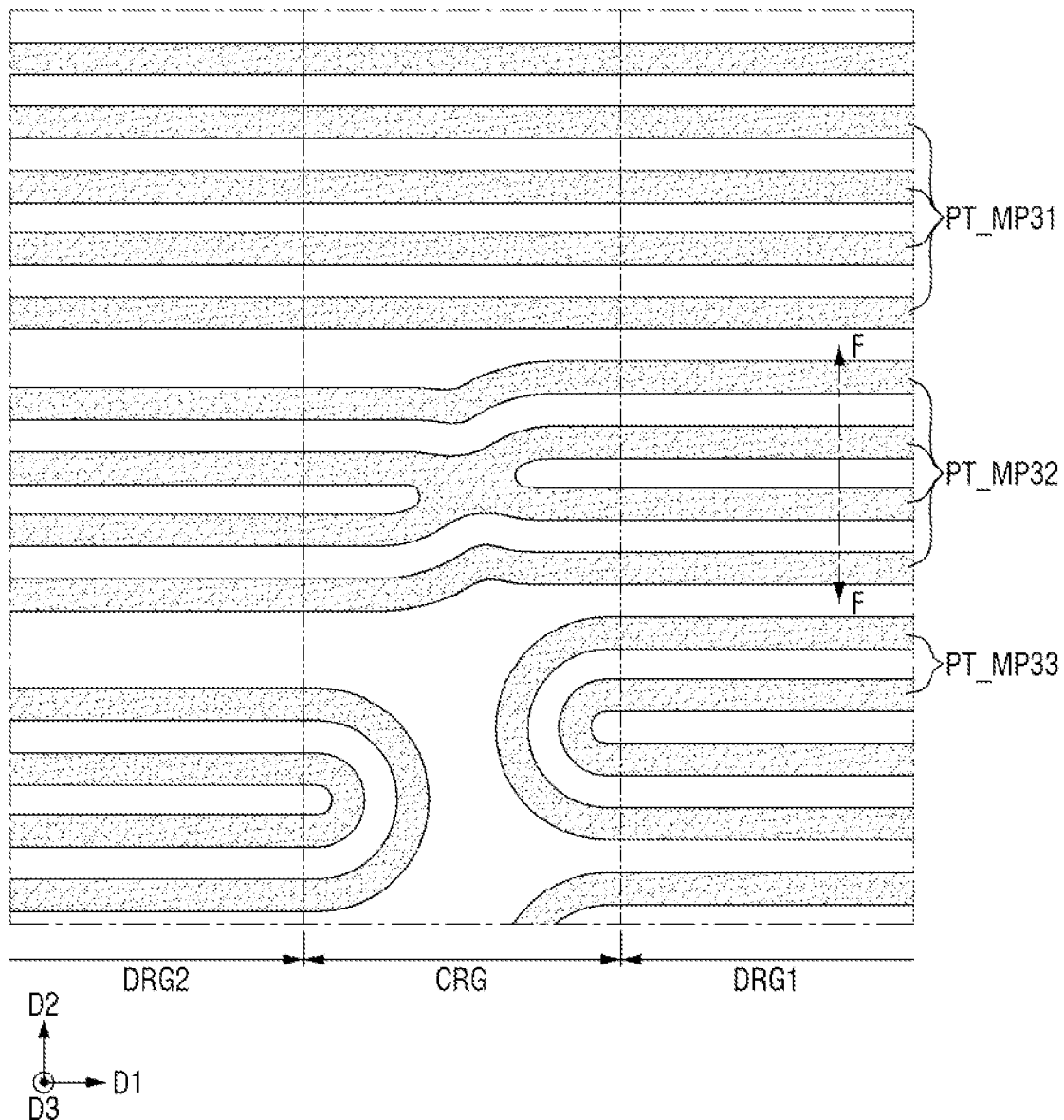
Figure 34B:
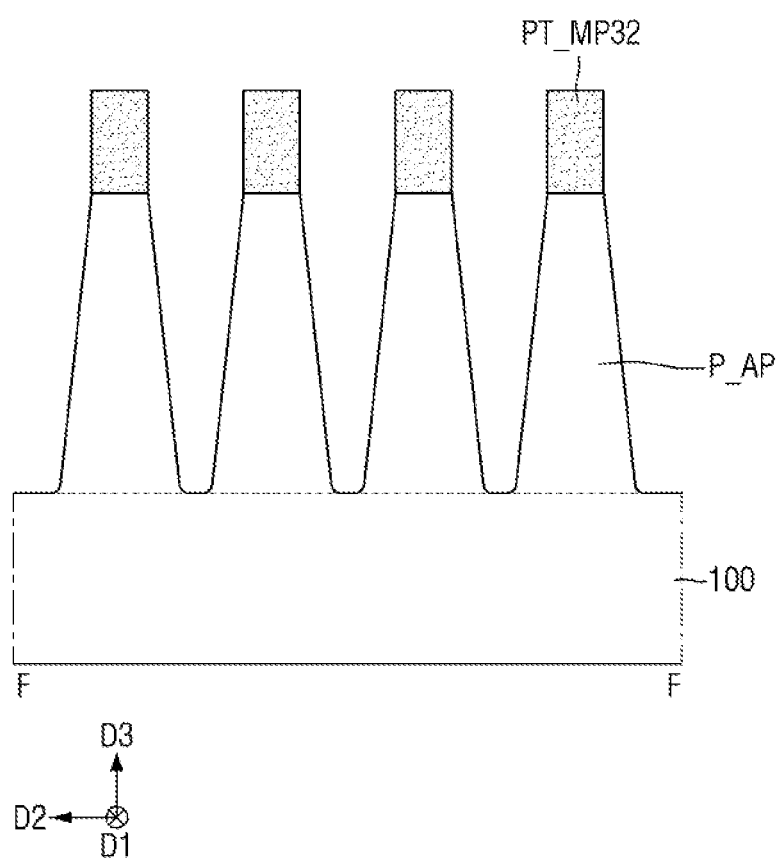

For reference, FIGS. 32B, 33B and 34B are cross-sectional views taken along F-F of FIGS. 32A, 33A and 34A, respectively. On the other hand, FIGS. 32B, 33B and 34B are cross-sectional views in which a second mask transfer pattern PT_MP12, a second upper hard mask pattern PT_MP22 and a second lower hard mask pattern PT_MP32 are cut in the second direction D2, respectively. In addition, the cross-sectional views in which a first mask transfer pattern PT_MP11, a first upper hard mask pattern PT_MP21 and a first lower hard mask pattern PT_MP31 are cut in the second direction D2 may be substantially the same as FIGS. 32B, 33B and 34B. Also, the cross-sectional views in which a third mask transfer pattern PT_MP13, a third upper hard mask pattern PT_MP23 and a third lower hard mask pattern PT_MP33 are cut in the second direction D2 may be substantially the same as FIGS. 32B, 33B and 34B.

Referring to FIGS. 32A and 32B, a photo process may be performed on the substrate 100 using a photomask.

The photomask may be fabricated by the method for fabricating the mask described referring to FIGS. 26 to 31.

A first mask spacer film PT_SPL1 and a second mask spacer film PT_SPL2 are sequentially formed on the substrate 100.

The first to third mask transfer patterns PT_MP11, PT_MP12, and PT_MP13 may be formed on the second mask spacer film PT_SPL2.

The first mask transfer pattern PT_MP11 is formed by transferring the first photomask pattern (M_LP11 of FIG. 31) onto the substrate 100 through the photo process. The second mask transfer pattern PT_MP12 is formed by transferring the second and third photomask patterns M_LP21 and M_LP22 onto the substrate 100 through the photo process. The third mask transfer pattern PT_MP13 is formed by transferring the fourth and fifth photomask patterns M_LP31 and M_LP32 onto the substrate 100 through the photo process. In an embodiment of the present disclosure, the first to third mask transfer patterns PT_MP11, PT_MP12, and PT_MP13 may be used as mandrels for a self-aligned quadruple patterning (SAQP) process.

Referring to FIGS. 33A and 33B, an upper spacer pattern may be formed on the second mask spacer film PT_SPL2 along the outer side walls of the first to third mask transfer patterns PT_MP11, PT_MP12, and PT_MP13.

After forming the upper spacer pattern, the first to third mask transfer patterns PT_MP11, PT_MP12, and PT_MP13 may be removed.

Subsequently, the second mask spacer film PT_SPL2 may be etched, using the upper spacer pattern as a mask. Accordingly, first to third upper hard mask patterns PT_MP21, PT_MP22, and PT_MP23 may be formed on the first mask spacer film PT_SPL1.

Referring to FIGS. 34A and 34B, a lower spacer pattern may be formed on the first mask spacer film PT_SPL1 along the outer side walls of the first to third upper hard mask patterns PT_MP21, PT_MP22, and PT_MP23.

After forming the lower spacer pattern, the first to third upper hard mask patterns PT_MP21, PT_MP22, and PT_MP23 may be removed.

Subsequently, the first mask spacer film PT_SPL1 may be etched, using the lower spacer pattern as a mask. Accordingly, the first to third lower hard mask patterns PT_MP31, PT_MP32, and PT_MP33 may be formed on the substrate 100.

Subsequently, the substrate 100 may be etched, using the first to third lower hard mask patterns PT_MP31, PT_MP32, and PT_MP33 as masks. A pre multi-channel active pattern P_AP having a shape corresponding to the first to third lower hard mask patterns PT_MP31, PT_MP32, and PT_MP33 may be formed through the etching process.

Subsequently, referring to FIG. 1, by removing a part of the pre multi-channel active pattern P_AP located in the connecting region CRG, the first to third connecting fin type patterns CF1, CF2, and CF3 may be formed in the connecting region CRG.

In concluding the detailed description, those skilled in the art will appreciate that many variations and modifications may be made to the specific embodiments described without departing from the spirit and scope of the present disclosure as defined in the appended claims. Therefore, the disclosed embodiments of the present disclosure are used in a generic and descriptive sense only and not for purposes of limitation.

What is claimed is:

1. A semiconductor device comprising:
    a substrate including a first region, a second region, and a connecting region placed between the first region and the second region;
    a plurality of first multi-channel active patterns placed in the first region of the substrate;
    a plurality of second multi-channel active patterns placed in the second region of the substrate;
    a first connecting fin type pattern which is placed in the connecting region of the substrate and extends from the first region to the second region in a first direction; and
    a field insulating film which is placed on the substrate and covers an upper surface of the first connecting fin type pattern,
    wherein a width of the first connecting fin type pattern in a second direction decreases and then increases as it goes away from the first region, and
    the first direction is perpendicular to the second direction.

2. The semiconductor device of claim 1, wherein the first connecting fin type pattern includes a bridge portion, and a first branch portion and a second branch portion protruding from the bridge portion toward the first region, and
    the first branch portion and the second branch portion are spaced apart from each other in the second direction.

3. The semiconductor device of claim 2, wherein the first connecting fin type pattern includes a third branch portion and a fourth branch portion protruding from the bridge portion toward the second region, and
    the third branch portion and the fourth branch portion are spaced apart from each other in the second direction.

4. The semiconductor device of claim 2, wherein the bridge portion extends to the second region.

5. The semiconductor device of claim 1, wherein the first connecting fin type pattern is directly connected to two of the first multi-channel active patterns and two of the second multi-channel active patterns.

6. The semiconductor device of claim 1, wherein the first connecting fin type pattern is directly connected to one of the first multi-channel active patterns and two of the second multi-channel active patterns.

7. The semiconductor device of claim 1, wherein the first connecting fin type pattern is directly connected to one of the first multi-channel active patterns and one of the second multi-channel active patterns.

8. The semiconductor device of claim 1, further comprising:
    a second connecting fin type pattern placed in the connecting region of the substrate,
    wherein an upper surface of the second connecting fin type pattern has a half ring shape.

9. The semiconductor device of claim 1, further comprising:
    a second connecting fin type pattern which is placed in the connecting region of the substrate and extends from the first region to the second region,
    wherein a width of the second connecting fin type pattern in the second direction is smaller than the width of the first connecting fin type pattern in the second direction.

10. The semiconductor device of claim 1, wherein each of the first multi-channel active patterns and the second multi-channel active patterns is a fin type pattern.

11. The semiconductor device of claim 1, wherein each of the first multi-channel active patterns and the second multi-channel active patterns includes a lower fin type pattern, and a sheet pattern on the lower fin type pattern.

12. A semiconductor device comprising:
    a substrate including a first region, a second region, and a connecting region placed between the first region and the second region;
    a plurality of first multi-channel active patterns placed in the first region of the substrate;
    a plurality of second multi-channel active patterns placed in the second region of the substrate;
    a first connecting fin type pattern which is placed in the connecting region of the substrate and extends from the first region to the second region in a first direction; and
    a field insulating film which is placed on the substrate and covers an upper surface of the first connecting fin type pattern,
    wherein the first connecting fin type pattern includes a bridge portion, and a first branch portion and a second branch portion protruding from the bridge portion toward the first region, and
    the first branch portion and the second branch portion are spaced apart from each other in a second direction perpendicular to the first direction.

13. The semiconductor device of claim 12, wherein the bridge portion extends to the second region, and
    a width of the bridge portion in the second direction decreases and then increases, as it goes away from the first branch portion and the second branch portion.

14. The semiconductor device of claim 13, wherein the bridge portion is directly connected to two or less of the second multi-channel active patterns.

15. The semiconductor device of claim 12, wherein the first connecting fin type pattern includes a third branch portion and a fourth branch portion protruding from the bridge portion toward the second region, and the third branch portion and the fourth branch portion are spaced apart from each other in the second direction.

16. The semiconductor device of claim 15, wherein one or both of the third branch portion and the fourth branch portion are directly connected to the second multi-channel active patterns.

17. The semiconductor device of claim 12, wherein one or both of the first branch portion and the second branch portion are directly connected to the first multi-channel active patterns.

18. A semiconductor device comprising:
a substrate including a first region, a second region, and a connecting region placed between the first region and the second region;
a plurality of first multi-channel active patterns placed in the first region of the substrate;
a plurality of second multi-channel active patterns placed in the second region of the substrate;
a first connecting fin type pattern which is placed in the connecting region of the substrate and extends from the first region to the second region in a first direction;
a second connecting fin type pattern which is placed in the connecting region of the substrate and has a half ring-shaped upper surface;
a third connecting fin type pattern which is placed between the first connecting fin type pattern and the second connecting fin type pattern, and extends in the first direction along a profile of an outer side wall of the first connecting fin type pattern;
a field insulating film which is placed on the substrate and covers an upper surface of the first connecting fin type pattern, an upper surface of the second connecting fin type pattern, and
an upper surface of the third connecting fin type pattern;
a first gate electrode which extends in a second direction perpendicular to the first direction, on the first multi-channel active patterns; and
a second gate electrode which extends in the second direction, on the second multi-channel active patterns,
wherein a width of the first connecting fin type pattern in the second direction decreases and then increases, as it goes away from the first region.

19. The semiconductor device of claim 18, wherein the upper surface of the first connecting fin type pattern has a Y shape.

20. The semiconductor device of claim 18, wherein the upper surface of the first connecting fin type pattern has an X shape.

\* \* \* \* \*